(12) United States Patent
Latawiec

(10) Patent No.: US 12,140,778 B2
(45) Date of Patent: Nov. 12, 2024

(54) METASURFACES FOR LASER SPECKLE REDUCTION

(71) Applicant: Metalenz, Inc., Boston, MA (US)

(72) Inventor: Pawel Latawiec, Cambridge, MA (US)

(73) Assignee: Metalenz, Inc., Boston, MA (US)

( * ) Notice: Subject to any disclaimer, the term of this patent is extended or adjusted under 35 U.S.C. 154(b) by 840 days.

(21) Appl. No.: 17/255,918

(22) PCT Filed: Jul. 2, 2019

(86) PCT No.: PCT/US2019/040302
§ 371 (c)(1),
(2) Date: Dec. 23, 2020

(87) PCT Pub. No.: WO2020/010084
PCT Pub. Date: Jan. 9, 2020

(65) Prior Publication Data
US 2021/0263329 A1    Aug. 26, 2021

Related U.S. Application Data

(60) Provisional application No. 62/693,065, filed on Jul. 2, 2018.

(51) Int. Cl.
G02B 27/48 (2006.01)
F21V 8/00 (2006.01)
G02B 1/00 (2006.01)
H01S 5/42 (2006.01)

(52) U.S. Cl.
CPC ............. *G02B 27/48* (2013.01); *G02B 1/002* (2013.01); *G02B 6/0006* (2013.01); *G02B 6/001* (2013.01); *H01S 5/423* (2013.01)

(58) Field of Classification Search
CPC ...... G02B 1/002; G02B 6/0006; G02B 6/001; G02B 27/48; H01S 5/423
See application file for complete search history.

(56) References Cited

U.S. PATENT DOCUMENTS

| | | | |
|---|---|---|---|
| 3,877,034 | A | 4/1975 | Nelson |
| 4,777,116 | A | 10/1988 | Kawatsuki et al. |
| 4,856,899 | A | 8/1989 | Iwaoka et al. |
| 5,085,496 | A | 2/1992 | Yoshida et al. |
| 5,337,146 | A | 8/1994 | Azzam |

(Continued)

FOREIGN PATENT DOCUMENTS

| | | |
|---|---|---|
| CA | 3006173 A1 | 6/2017 |
| CA | 3020261 A1 | 10/2017 |

(Continued)

OTHER PUBLICATIONS

Jin et al., "Waveforms for Optimal Sub-keV High-Order Harmonics with Synthesized Two- or Three-Colour Laser Fields", Nature Communications, May 30, 2014, vol. 5, No. 4003, pp. 1-6.

(Continued)

*Primary Examiner* — Daniel Petkovsek
(74) *Attorney, Agent, or Firm* — KPPB LLP

(57) ABSTRACT

An apparatus that relies on patterned metasurfaces to reduce speckle when illuminating an object with coherent light. The metasurfaces serve to increase one or more of angle diversity and wavelength diversity resulting from illumination by a coherent source.

9 Claims, 9 Drawing Sheets

(56) References Cited

U.S. PATENT DOCUMENTS

| | | |
|---|---|---|
| 5,452,126 A | 9/1995 | Johnson |
| 5,620,792 A | 4/1997 | Challener, IV |
| 6,097,856 A | 8/2000 | Hammond, Jr. |
| 6,731,839 B2 | 5/2004 | Bhagavatula et al. |
| 6,825,986 B2 | 11/2004 | Ashkinazy et al. |
| 6,834,027 B1 | 12/2004 | Sakaguchi et al. |
| 6,924,457 B2 | 8/2005 | Koyama et al. |
| 6,927,922 B2 | 8/2005 | George et al. |
| 7,057,151 B2 | 6/2006 | Lezec et al. |
| 7,061,612 B2 | 6/2006 | Johnston |
| 7,061,693 B2 | 6/2006 | Zalevsky |
| 7,171,078 B2 | 1/2007 | Sasaki et al. |
| 7,171,084 B2 | 1/2007 | Izumi et al. |
| 7,186,969 B2 | 3/2007 | Altendorf et al. |
| 7,241,988 B2 | 7/2007 | Gruber et al. |
| 7,324,210 B2 | 1/2008 | De Groot et al. |
| 7,327,468 B2 | 2/2008 | Maznev et al. |
| 7,402,131 B2 | 7/2008 | Mueth et al. |
| 7,450,618 B2 | 11/2008 | Dantus et al. |
| 7,547,874 B2 | 6/2009 | Liang |
| 7,561,264 B2 | 7/2009 | Treado et al. |
| 7,576,899 B2 | 8/2009 | Kanesaka et al. |
| 7,679,830 B2 | 3/2010 | Dowski, Jr. |
| 7,684,097 B2 | 3/2010 | Fukumoto et al. |
| 7,773,307 B2 | 8/2010 | Shih |
| 7,800,683 B2 | 9/2010 | Zalevsky et al. |
| 7,812,295 B2 | 10/2010 | Zalevsky et al. |
| 7,928,900 B2 | 4/2011 | Fuller et al. |
| 7,929,220 B2 | 4/2011 | Sayag |
| 7,965,607 B2 | 6/2011 | Fukumoto et al. |
| 8,009,358 B2 | 8/2011 | Zalevsky et al. |
| 8,040,604 B2 | 10/2011 | Zalevsky et al. |
| 8,107,705 B2 | 1/2012 | Dowski, Jr. et al. |
| 8,152,307 B2 | 4/2012 | Duelli et al. |
| 8,169,703 B1 | 5/2012 | Mossberg et al. |
| 8,192,022 B2 | 6/2012 | Zalevsky |
| 8,212,866 B2 | 7/2012 | Lemmer et al. |
| 8,318,386 B2 | 11/2012 | Kobrin |
| 8,328,396 B2 | 12/2012 | Capasso et al. |
| 8,351,048 B2 | 1/2013 | Millerd |
| 8,351,120 B2 | 1/2013 | Deng et al. |
| 8,390,932 B2 | 3/2013 | Jia et al. |
| 8,400,494 B2 | 3/2013 | Zalevsky et al. |
| 8,430,513 B2 | 4/2013 | Chang et al. |
| 8,451,368 B2 | 5/2013 | Sung et al. |
| 8,472,797 B2 | 6/2013 | Ok et al. |
| 8,481,948 B2 | 7/2013 | Frach et al. |
| 8,558,873 B2 | 10/2013 | Mceldowney |
| 8,587,474 B2 | 11/2013 | Fuller et al. |
| 8,649,631 B2 | 2/2014 | Islam et al. |
| 8,681,428 B1 | 3/2014 | Brown |
| 8,687,040 B2 | 4/2014 | Silveira |
| 8,716,677 B2 | 5/2014 | Cui |
| 8,734,033 B2 | 5/2014 | Walters et al. |
| 8,743,923 B2 * | 6/2014 | Geske ................ G01S 7/4815 372/50.12 |
| 8,816,460 B2 | 8/2014 | Kalevo et al. |
| 8,848,273 B2 | 9/2014 | Yu et al. |
| 8,876,289 B2 | 11/2014 | Dorronsoro Diaz et al. |
| 8,908,149 B2 | 12/2014 | Freimann |
| 8,912,973 B2 | 12/2014 | Werner et al. |
| 8,981,337 B1 | 3/2015 | Burckel et al. |
| 9,007,451 B2 | 4/2015 | Rogers et al. |
| 9,116,302 B2 | 8/2015 | Mccarthy et al. |
| 9,151,891 B2 | 10/2015 | Ma et al. |
| 9,212,899 B2 | 12/2015 | Johnson et al. |
| 9,298,060 B2 | 3/2016 | Shen et al. |
| 9,309,274 B2 | 4/2016 | Van Der B. et al. |
| 9,310,535 B1 | 4/2016 | Greiner et al. |
| 9,329,484 B1 | 5/2016 | Markle et al. |
| 9,330,704 B2 | 5/2016 | Nishimura et al. |
| 9,367,036 B2 | 6/2016 | Pyun et al. |
| 9,369,621 B2 | 6/2016 | Malone et al. |
| 9,391,700 B1 | 7/2016 | Bruce et al. |
| 9,392,153 B2 | 7/2016 | Myhre et al. |
| 9,411,103 B2 | 8/2016 | Astratov |
| 9,482,796 B2 | 11/2016 | Arbabi et al. |
| 9,500,771 B2 | 11/2016 | Liu et al. |
| 9,553,423 B2 | 1/2017 | Chen et al. |
| 9,557,585 B1 | 1/2017 | Yap et al. |
| 9,606,415 B2 | 3/2017 | Zheludev et al. |
| 9,609,190 B2 | 3/2017 | Lee et al. |
| 9,739,918 B2 | 8/2017 | Arbabi et al. |
| 9,766,463 B2 | 9/2017 | Border et al. |
| 9,778,404 B2 | 10/2017 | Divliansky et al. |
| 9,825,074 B2 | 11/2017 | Tian et al. |
| 9,829,700 B2 | 11/2017 | Parent et al. |
| 9,835,870 B2 | 12/2017 | Astratov et al. |
| 9,836,122 B2 | 12/2017 | Border |
| 9,869,580 B2 | 1/2018 | Grossinger et al. |
| 9,880,377 B1 | 1/2018 | Safrani et al. |
| 9,885,859 B2 | 2/2018 | Harris |
| 9,891,393 B2 | 2/2018 | Reece |
| 9,939,129 B2 | 4/2018 | Byrnes et al. |
| 9,947,118 B2 | 4/2018 | Khare et al. |
| 9,952,096 B2 | 4/2018 | Kats et al. |
| 9,958,251 B1 | 5/2018 | Brock et al. |
| 9,967,541 B2 | 5/2018 | Piestun |
| 9,978,801 B2 | 5/2018 | Park et al. |
| 9,989,680 B2 | 6/2018 | Arbabi et al. |
| 9,992,474 B2 | 6/2018 | Grunnet-Jepsen et al. |
| 9,995,859 B2 | 6/2018 | Kamali et al. |
| 9,995,930 B2 | 6/2018 | Arbabi et al. |
| 10,007,118 B2 | 6/2018 | Border |
| 10,054,859 B2 | 8/2018 | Ye et al. |
| 10,084,239 B2 | 9/2018 | Shaver et al. |
| 10,108,085 B2 | 10/2018 | Peters et al. |
| 10,126,466 B2 | 11/2018 | Lin et al. |
| 10,132,465 B2 | 11/2018 | Byrnes et al. |
| 10,149,612 B2 | 12/2018 | Muyo et al. |
| 10,155,846 B2 | 12/2018 | Fuji et al. |
| 10,234,383 B2 | 3/2019 | Wang et al. |
| 10,254,454 B2 | 4/2019 | Klug et al. |
| 10,267,957 B2 | 4/2019 | Kamali et al. |
| 10,310,148 B2 | 6/2019 | Stewart et al. |
| 10,310,387 B2 | 6/2019 | Palmer et al. |
| 10,315,951 B2 | 6/2019 | Toussaint et al. |
| 10,317,667 B2 | 6/2019 | Waller et al. |
| 10,324,314 B2 | 6/2019 | Czaplewski et al. |
| 10,338,275 B1 | 7/2019 | Acosta et al. |
| 10,341,640 B2 | 7/2019 | Shechtman et al. |
| 10,345,246 B2 | 7/2019 | Tian et al. |
| 10,345,519 B1 | 7/2019 | Miller et al. |
| 10,365,416 B2 | 7/2019 | Zhan et al. |
| 10,371,936 B2 | 8/2019 | Didomenico |
| 10,386,620 B2 | 8/2019 | Astratov et al. |
| 10,402,993 B2 | 9/2019 | Han et al. |
| 10,408,416 B2 | 9/2019 | Khorasaninejad et al. |
| 10,408,419 B2 | 9/2019 | Aieta et al. |
| 10,416,565 B2 | 9/2019 | Ahmed et al. |
| 10,435,814 B2 | 10/2019 | Plummer et al. |
| 10,440,244 B2 | 10/2019 | Rosenblatt et al. |
| 10,440,300 B2 | 10/2019 | Rephaeli et al. |
| 10,466,394 B2 | 11/2019 | Lin et al. |
| 10,468,447 B2 | 11/2019 | Akselrod et al. |
| 10,514,296 B2 | 12/2019 | Han et al. |
| 10,527,832 B2 | 1/2020 | Schwab et al. |
| 10,527,851 B2 | 1/2020 | Lin et al. |
| 10,536,688 B2 | 1/2020 | Haas et al. |
| 10,539,723 B2 | 1/2020 | Iazikov et al. |
| 10,545,323 B2 | 1/2020 | Schwab et al. |
| 10,591,643 B2 | 3/2020 | Lin et al. |
| 10,670,782 B2 | 6/2020 | Arbabi et al. |
| 10,725,290 B2 | 7/2020 | Fan et al. |
| 10,795,168 B2 * | 10/2020 | Riley, Jr. ................ G02B 27/12 |
| 10,816,704 B2 | 10/2020 | Arbabi et al. |
| 10,816,815 B2 | 10/2020 | Aieta et al. |
| 11,092,717 B2 | 8/2021 | Capasso et al. |
| 11,231,544 B2 | 1/2022 | Lin et al. |
| 11,298,052 B2 | 4/2022 | Palikaras et al. |
| 11,353,626 B2 * | 6/2022 | You ................ G02B 27/4272 |
| 11,385,516 B2 | 7/2022 | Didomenico |
| 11,579,456 B2 | 2/2023 | Riley et al. |
| 11,835,680 B2 | 12/2023 | Groever et al. |

(56) References Cited

U.S. PATENT DOCUMENTS

| | | |
|---|---|---|
| 11,978,752 B2 | 5/2024 | Devlin et al. |
| 2002/0048727 A1 | 4/2002 | Zhou et al. |
| 2002/0118903 A1 | 8/2002 | Cottrell et al. |
| 2002/0181126 A1 | 12/2002 | Nishioka |
| 2003/0107787 A1 | 6/2003 | Bablumyan |
| 2004/0173738 A1 | 9/2004 | Mizuno |
| 2004/0184752 A1 | 9/2004 | Aoki et al. |
| 2004/0190116 A1 | 9/2004 | Lezec et al. |
| 2004/0258128 A1 | 12/2004 | Johs et al. |
| 2005/0151698 A1 | 7/2005 | Mohamadi |
| 2005/0161589 A1 | 7/2005 | Kim et al. |
| 2005/0211665 A1 | 9/2005 | Gao et al. |
| 2005/0220162 A1 | 10/2005 | Nakamura |
| 2005/0239003 A1 | 10/2005 | Chiodini et al. |
| 2006/0042322 A1 | 3/2006 | Mendoza et al. |
| 2006/0127829 A1 | 6/2006 | Deng et al. |
| 2007/0026585 A1 | 2/2007 | Wong et al. |
| 2007/0273957 A1 | 11/2007 | Zalevsky et al. |
| 2009/0135086 A1 | 5/2009 | Fuller et al. |
| 2009/0230333 A1 | 9/2009 | Eleftheriades |
| 2009/0296223 A1 | 12/2009 | Werner et al. |
| 2010/0033701 A1 | 2/2010 | Lee et al. |
| 2010/0055621 A1 | 3/2010 | Hatakeyama et al. |
| 2010/0110430 A1 | 5/2010 | Ebbesen et al. |
| 2010/0134869 A1 | 6/2010 | Bernet et al. |
| 2010/0177164 A1 | 7/2010 | Zalevsky et al. |
| 2010/0187658 A1 | 7/2010 | Wei |
| 2010/0226134 A1 | 9/2010 | Capasso et al. |
| 2010/0232017 A1 | 9/2010 | Mccarthy et al. |
| 2010/0255428 A1 | 10/2010 | Chen et al. |
| 2010/0259804 A1 | 10/2010 | Buschbeck et al. |
| 2011/0012807 A1 | 1/2011 | Sorvala |
| 2011/0019180 A1 | 1/2011 | Kruglick |
| 2011/0149251 A1 | 6/2011 | Duelli |
| 2011/0187577 A1 | 8/2011 | Fuller et al. |
| 2012/0140235 A1 | 6/2012 | Lee et al. |
| 2012/0258407 A1 | 10/2012 | Sirat |
| 2012/0293854 A1 | 11/2012 | Zheludev et al. |
| 2012/0327666 A1 | 12/2012 | Liu et al. |
| 2012/0328240 A1 | 12/2012 | Ma et al. |
| 2013/0016030 A1 | 1/2013 | Liu et al. |
| 2013/0037873 A1 | 2/2013 | Suzuki et al. |
| 2013/0050285 A1 | 2/2013 | Takahashi et al. |
| 2013/0058071 A1 | 3/2013 | Ben |
| 2013/0194787 A1 | 8/2013 | Geske et al. |
| 2013/0208332 A1 | 8/2013 | Yu et al. |
| 2014/0043846 A1 | 2/2014 | Yang et al. |
| 2014/0085693 A1 | 3/2014 | Mosallaei et al. |
| 2014/0210835 A1 | 7/2014 | Hong et al. |
| 2015/0017466 A1 | 1/2015 | Ayon et al. |
| 2015/0018500 A1 | 1/2015 | Gerber et al. |
| 2015/0055745 A1 | 2/2015 | Holzner et al. |
| 2015/0090862 A1 | 4/2015 | Matsui et al. |
| 2015/0092139 A1 | 4/2015 | Eguchi |
| 2015/0098002 A1 | 4/2015 | Wang |
| 2015/0116721 A1 | 4/2015 | Kats et al. |
| 2015/0219806 A1 | 8/2015 | Arbabi et al. |
| 2015/0241608 A1 | 8/2015 | Shian et al. |
| 2015/0316717 A1 | 11/2015 | Astratov |
| 2016/0025914 A1 | 1/2016 | Brongersma et al. |
| 2016/0037146 A1 | 2/2016 | Mcgrew |
| 2016/0077261 A1 | 3/2016 | Arbabi et al. |
| 2016/0133762 A1 | 5/2016 | Blasco et al. |
| 2016/0161826 A1 | 6/2016 | Shen et al. |
| 2016/0195705 A1 | 7/2016 | Betzig et al. |
| 2016/0254638 A1 | 9/2016 | Chen et al. |
| 2016/0276979 A1 | 9/2016 | Shaver et al. |
| 2016/0299337 A1 | 10/2016 | Arbabi et al. |
| 2016/0299426 A1 | 10/2016 | Gates et al. |
| 2016/0306079 A1 | 10/2016 | Arbabi et al. |
| 2016/0306157 A1 | 10/2016 | Rho et al. |
| 2016/0318067 A1 | 11/2016 | Banerjee et al. |
| 2016/0331457 A1 | 11/2016 | Varghese et al. |
| 2016/0341859 A1 | 11/2016 | Shvets et al. |
| 2016/0359235 A1 | 12/2016 | Driscoll et al. |
| 2016/0361002 A1 | 12/2016 | Palikaras et al. |
| 2016/0370568 A1 | 12/2016 | Toussaint et al. |
| 2017/0003169 A1 | 1/2017 | Shaltout et al. |
| 2017/0010466 A1 | 1/2017 | Klug et al. |
| 2017/0030773 A1 | 2/2017 | Han et al. |
| 2017/0038574 A1 | 2/2017 | Zhuang et al. |
| 2017/0045652 A1 | 2/2017 | Arbabi et al. |
| 2017/0082263 A1 | 3/2017 | Byrnes et al. |
| 2017/0090221 A1 | 3/2017 | Atwater |
| 2017/0121843 A1 | 5/2017 | Plummer et al. |
| 2017/0125911 A1 | 5/2017 | Alu et al. |
| 2017/0131460 A1 | 5/2017 | Lin et al. |
| 2017/0146806 A1 | 5/2017 | Lin et al. |
| 2017/0176758 A1 | 6/2017 | Lerner et al. |
| 2017/0186166 A1 | 6/2017 | Grunnet-Jepsen et al. |
| 2017/0201658 A1 | 7/2017 | Rosenblatt et al. |
| 2017/0212285 A1 | 7/2017 | Arbabi et al. |
| 2017/0235162 A1* | 8/2017 | Shaltout .............. G02F 1/093 359/9 |
| 2017/0250577 A1 | 8/2017 | Ho et al. |
| 2017/0293141 A1 | 10/2017 | Schowengerdt et al. |
| 2017/0299784 A1 | 10/2017 | Mikkelsen et al. |
| 2017/0310907 A1 | 10/2017 | Wang |
| 2017/0329201 A1 | 11/2017 | Arnold |
| 2017/0374352 A1 | 12/2017 | Horesh |
| 2018/0035101 A1 | 2/2018 | Osterhout |
| 2018/0044234 A1 | 2/2018 | Hokansson et al. |
| 2018/0045953 A1 | 2/2018 | Fan et al. |
| 2018/0052276 A1 | 2/2018 | Klienman et al. |
| 2018/0052320 A1 | 2/2018 | Curtis et al. |
| 2018/0107015 A1 | 4/2018 | Dümpelmann et al. |
| 2018/0129866 A1 | 5/2018 | Hicks et al. |
| 2018/0172988 A1 | 6/2018 | Ahmed et al. |
| 2018/0216797 A1 | 8/2018 | Khorasaninejad et al. |
| 2018/0217395 A1 | 8/2018 | Lin et al. |
| 2018/0231700 A1 | 8/2018 | Ahmed et al. |
| 2018/0236596 A1 | 8/2018 | Ihlemann et al. |
| 2018/0246262 A1 | 8/2018 | Zhan et al. |
| 2018/0248268 A1 | 8/2018 | Shvets et al. |
| 2018/0252857 A1 | 9/2018 | Glik et al. |
| 2018/0259700 A1 | 9/2018 | Khorasaninejad et al. |
| 2018/0259757 A1 | 9/2018 | Urzhumov |
| 2018/0267605 A1 | 9/2018 | Border |
| 2018/0274750 A1 | 9/2018 | Byrnes et al. |
| 2018/0292644 A1 | 10/2018 | Kamali et al. |
| 2018/0299595 A1 | 10/2018 | Arbabi et al. |
| 2018/0314130 A1 | 11/2018 | Joo et al. |
| 2018/0341090 A1 | 11/2018 | Devlin et al. |
| 2018/0364158 A1 | 12/2018 | Wang et al. |
| 2019/0003892 A1 | 1/2019 | Aieta et al. |
| 2019/0025463 A1 | 1/2019 | She et al. |
| 2019/0025477 A1 | 1/2019 | She et al. |
| 2019/0041642 A1 | 2/2019 | Haddick et al. |
| 2019/0041736 A1 | 2/2019 | Grunnet-Jepsen et al. |
| 2019/0044003 A1 | 2/2019 | Heck et al. |
| 2019/0049632 A1 | 2/2019 | Shin et al. |
| 2019/0049732 A1 | 2/2019 | Lee et al. |
| 2019/0057512 A1 | 2/2019 | Han et al. |
| 2019/0064532 A1 | 2/2019 | Riley, Jr. et al. |
| 2019/0086579 A1 | 3/2019 | Kim et al. |
| 2019/0086683 A1 | 3/2019 | Aieta et al. |
| 2019/0101448 A1 | 4/2019 | Lee et al. |
| 2019/0113775 A1 | 4/2019 | Jang et al. |
| 2019/0120817 A1 | 4/2019 | Anderson |
| 2019/0121004 A1 | 4/2019 | Ahmed et al. |
| 2019/0137075 A1 | 5/2019 | Aieta et al. |
| 2019/0137762 A1 | 5/2019 | Hu |
| 2019/0137793 A1 | 5/2019 | Luo et al. |
| 2019/0154877 A1 | 5/2019 | Capasso et al. |
| 2019/0162592 A1 | 5/2019 | Khorasaninejad et al. |
| 2019/0170655 A1 | 6/2019 | Smith |
| 2019/0191144 A1 | 6/2019 | Arbabi et al. |
| 2019/0196068 A1 | 6/2019 | Tsai et al. |
| 2019/0206136 A1 | 7/2019 | West et al. |
| 2019/0219835 A1 | 7/2019 | Skinner et al. |
| 2019/0235139 A1 | 8/2019 | Chen et al. |
| 2019/0250107 A1 | 8/2019 | Sreenivasan et al. |
| 2019/0369401 A1 | 12/2019 | Rolland et al. |
| 2019/0377084 A1 | 12/2019 | Sleasman et al. |

(56) References Cited

U.S. PATENT DOCUMENTS

| | | |
|---|---|---|
| 2019/0391378 A1 | 12/2019 | Eichelkraut et al. |
| 2020/0025888 A1 | 1/2020 | Jang et al. |
| 2020/0052027 A1 | 2/2020 | Arbabi et al. |
| 2020/0096672 A1 | 3/2020 | Yu et al. |
| 2020/0150311 A1 | 5/2020 | Zhang et al. |
| 2020/0249429 A1 | 8/2020 | Han et al. |
| 2020/0271941 A1 | 8/2020 | Riley, Jr. et al. |
| 2020/0355913 A1 | 11/2020 | Park et al. |
| 2021/0028215 A1 | 1/2021 | Devlin et al. |
| 2021/0109364 A1 | 4/2021 | Aieta et al. |
| 2021/0149081 A1 | 5/2021 | Groever et al. |
| 2021/0190593 A1 | 6/2021 | Yao et al. |
| 2021/0208469 A1 | 7/2021 | Didomenico |
| 2021/0288095 A1 | 9/2021 | Delga et al. |
| 2021/0302763 A1 | 9/2021 | Yao et al. |
| 2021/0311588 A1 | 10/2021 | Han et al. |
| 2022/0050294 A1 | 2/2022 | Fermigier et al. |
| 2022/0052093 A1 | 2/2022 | Devlin et al. |
| 2022/0091428 A1 | 3/2022 | Riley, Jr. et al. |
| 2022/0107263 A1 | 4/2022 | Biesinger et al. |
| 2022/0206186 A1 | 6/2022 | Chen et al. |
| 2022/0214219 A1 | 7/2022 | Faraon et al. |
| 2023/0194883 A1 | 6/2023 | Riley et al. |

FOREIGN PATENT DOCUMENTS

| | | |
|---|---|---|
| CA | 3064764 A1 | 11/2018 |
| CN | 101158727 A | 4/2008 |
| CN | 101164147 A | 4/2008 |
| CN | 100476504 C | 4/2009 |
| CN | 101510013 B | 6/2010 |
| CN | 101510012 B | 8/2010 |
| CN | 101510011 B | 9/2010 |
| CN | 101241173 B | 8/2011 |
| CN | 202854395 U | 4/2013 |
| CN | 103092049 A | 5/2013 |
| CN | 203799117 U | 8/2014 |
| CN | 204422813 U | 6/2015 |
| CN | 104932043 A | 9/2015 |
| CN | 104956491 A | 9/2015 |
| CN | 204719330 U | 10/2015 |
| CN | 105068396 A | 11/2015 |
| CN | 103869484 B | 1/2016 |
| CN | 105223689 A | 1/2016 |
| CN | 105278026 A | 1/2016 |
| CN | 105278309 A | 1/2016 |
| CN | 105655286 A | 6/2016 |
| CN | 105676314 A | 6/2016 |
| CN | 105917277 A | 8/2016 |
| CN | 103257441 B | 10/2016 |
| CN | 205620619 U | 10/2016 |
| CN | 104834079 B | 4/2017 |
| CN | 106611699 A | 5/2017 |
| CN | 104834089 B | 6/2017 |
| CN | 106848555 A | 6/2017 |
| CN | 106200276 B | 10/2017 |
| CN | 104834088 B | 12/2017 |
| CN | 105676314 B | 1/2018 |
| CN | 107561857 A | 1/2018 |
| CN | 108089325 A | 5/2018 |
| CN | 108291983 A | 7/2018 |
| CN | 207623619 U | 7/2018 |
| CN | 106199997 B | 8/2018 |
| CN | 108474869 A | 8/2018 |
| CN | 108507542 A | 9/2018 |
| CN | 207923075 U | 9/2018 |
| CN | 108680544 A | 10/2018 |
| CN | 108761779 A | 11/2018 |
| CN | 109000692 A | 12/2018 |
| CN | 208270846 U | 12/2018 |
| CN | 109196387 A | 1/2019 |
| CN | 106199956 B | 2/2019 |
| CN | 109360139 A | 2/2019 |
| CN | 106950195 B | 5/2019 |
| CN | 106324832 B | 7/2019 |
| CN | 106526730 B | 7/2019 |
| CN | 106485761 B | 8/2019 |
| CN | 110160685 A | 8/2019 |
| CN | 110678773 A | 1/2020 |
| CN | 111316138 A | 6/2020 |
| CN | 111580190 A | 8/2020 |
| CN | 111656707 A | 9/2020 |
| CN | 111819489 A | 10/2020 |
| CN | 213092332 U | 4/2021 |
| CN | 113050295 A | 6/2021 |
| CN | 113168022 A | 7/2021 |
| CN | 110376665 B | 8/2021 |
| CN | 213902664 U | 8/2021 |
| CN | 213903843 U | 8/2021 |
| CN | 214098104 U | 8/2021 |
| CN | 113703080 A | 11/2021 |
| CN | 113791524 A | 12/2021 |
| CN | 113807312 A | 12/2021 |
| CN | 113820839 A | 12/2021 |
| CN | 113834568 A | 12/2021 |
| CN | 113835227 A | 12/2021 |
| CN | 113851573 A | 12/2021 |
| CN | 215005942 U | 12/2021 |
| CN | 215010478 U | 12/2021 |
| CN | 110494771 B | 1/2022 |
| CN | 113885106 A | 1/2022 |
| CN | 113899451 A | 1/2022 |
| CN | 113900078 A | 1/2022 |
| CN | 113900162 A | 1/2022 |
| CN | 113917574 A | 1/2022 |
| CN | 113917578 A | 1/2022 |
| CN | 113934004 A | 1/2022 |
| CN | 113934005 A | 1/2022 |
| CN | 113959984 A | 1/2022 |
| CN | 114002707 A | 2/2022 |
| CN | 114019589 A | 2/2022 |
| CN | 114047632 A | 2/2022 |
| CN | 114047637 A | 2/2022 |
| CN | 114112058 A | 3/2022 |
| CN | 114156168 A | 3/2022 |
| CN | 114176492 A | 3/2022 |
| CN | 215932365 U | 3/2022 |
| CN | 114280704 A | 4/2022 |
| CN | 114280716 A | 4/2022 |
| CN | 114286953 A | 4/2022 |
| CN | 114296180 A | 4/2022 |
| CN | 114325886 A | 4/2022 |
| CN | 114326163 A | 4/2022 |
| CN | 114354141 A | 4/2022 |
| CN | 114373825 A | 4/2022 |
| CN | 114384612 A | 4/2022 |
| CN | 114397092 A | 4/2022 |
| CN | 114397718 A | 4/2022 |
| CN | 114415386 A | 4/2022 |
| CN | 216345776 U | 4/2022 |
| CN | 216351311 U | 4/2022 |
| CN | 216351591 U | 4/2022 |
| CN | 216355281 U | 4/2022 |
| CN | 216361353 U | 4/2022 |
| CN | 111316138 B | 5/2022 |
| CN | 114488365 A | 5/2022 |
| CN | 114543993 A | 5/2022 |
| CN | 114545367 A | 5/2022 |
| CN | 114545370 A | 5/2022 |
| CN | 114554062 A | 5/2022 |
| CN | 114561266 A | 5/2022 |
| CN | 216593224 U | 5/2022 |
| CN | 216605227 U | 5/2022 |
| CN | 216622749 U | 5/2022 |
| CN | 114578642 A | 6/2022 |
| CN | 114593689 A | 6/2022 |
| CN | 114623960 A | 6/2022 |
| CN | 114624878 A | 6/2022 |
| CN | 114660683 A | 6/2022 |
| CN | 114660780 A | 6/2022 |
| CN | 114690387 A | 7/2022 |
| CN | 114740631 A | 7/2022 |
| CN | 114743714 A | 7/2022 |
| CN | 114779437 A | 7/2022 |

(56) References Cited

FOREIGN PATENT DOCUMENTS

| | | |
|---|---|---|
| CN | 216896898 U | 7/2022 |
| CN | 216900930 U | 7/2022 |
| CN | 216901121 U | 7/2022 |
| CN | 216901165 U | 7/2022 |
| CN | 216901317 U | 7/2022 |
| CN | 216901952 U | 7/2022 |
| CN | 216903719 U | 7/2022 |
| CN | 216933177 U | 7/2022 |
| CN | 217034311 U | 7/2022 |
| CN | 217034418 U | 7/2022 |
| CN | 217034466 U | 7/2022 |
| CN | 114859446 A | 8/2022 |
| CN | 114859447 A | 8/2022 |
| CN | 114859570 A | 8/2022 |
| CN | 114935741 A | 8/2022 |
| CN | 217276608 U | 8/2022 |
| CN | 217278911 U | 8/2022 |
| CN | 217278915 U | 8/2022 |
| CN | 217278989 U | 8/2022 |
| CN | 217279003 U | 8/2022 |
| CN | 217279087 U | 8/2022 |
| CN | 217279110 U | 8/2022 |
| CN | 217279168 U | 8/2022 |
| CN | 217279244 U | 8/2022 |
| CN | 217280797 U | 8/2022 |
| CN | 217280851 U | 8/2022 |
| CN | 217281621 U | 8/2022 |
| CN | 217281623 U | 8/2022 |
| CN | 114995038 A | 9/2022 |
| CN | 115016099 A | 9/2022 |
| CN | 115016150 A | 9/2022 |
| CN | 115032766 A | 9/2022 |
| CN | 115047432 A | 9/2022 |
| CN | 115047548 A | 9/2022 |
| CN | 115047653 A | 9/2022 |
| CN | 115061114 A | 9/2022 |
| CN | 115079415 A | 9/2022 |
| CN | 115113174 A | 9/2022 |
| CN | 217456368 U | 9/2022 |
| CN | 217465697 U | 9/2022 |
| CN | 217466052 U | 9/2022 |
| CN | 217466667 U | 9/2022 |
| CN | 217467162 U | 9/2022 |
| CN | 217467176 U | 9/2022 |
| CN | 217467177 U | 9/2022 |
| CN | 217467226 U | 9/2022 |
| CN | 217467326 U | 9/2022 |
| CN | 217467327 U | 9/2022 |
| CN | 217467336 U | 9/2022 |
| CN | 217467338 U | 9/2022 |
| CN | 217467351 U | 9/2022 |
| CN | 217467352 U | 9/2022 |
| CN | 217467353 U | 9/2022 |
| CN | 217467355 U | 9/2022 |
| CN | 217467357 U | 9/2022 |
| CN | 217467358 U | 9/2022 |
| CN | 217467363 U | 9/2022 |
| CN | 217467364 U | 9/2022 |
| CN | 217467367 U | 9/2022 |
| CN | 217467368 U | 9/2022 |
| CN | 217467395 U | 9/2022 |
| CN | 217467396 U | 9/2022 |
| CN | 217467399 U | 9/2022 |
| CN | 217467439 U | 9/2022 |
| CN | 217467452 U | 9/2022 |
| CN | 115164714 A | 10/2022 |
| CN | 115166876 A | 10/2022 |
| CN | 115166958 A | 10/2022 |
| CN | 115185082 A | 10/2022 |
| CN | 115211799 A | 10/2022 |
| CN | 115236795 A | 10/2022 |
| CN | 217639515 U | 10/2022 |
| CN | 217639519 U | 10/2022 |
| CN | 217639539 U | 10/2022 |
| CN | 217639544 U | 10/2022 |
| CN | 217639611 U | 10/2022 |
| CN | 217639612 U | 10/2022 |
| CN | 217639613 U | 10/2022 |
| CN | 217639715 U | 10/2022 |
| CN | 217639718 U | 10/2022 |
| CN | 217639719 U | 10/2022 |
| CN | 217639720 U | 10/2022 |
| CN | 217639722 U | 10/2022 |
| CN | 217639723 U | 10/2022 |
| CN | 217639724 U | 10/2022 |
| CN | 217639725 U | 10/2022 |
| CN | 217639726 U | 10/2022 |
| CN | 217639763 U | 10/2022 |
| CN | 217639765 U | 10/2022 |
| CN | 217639767 U | 10/2022 |
| CN | 217639768 U | 10/2022 |
| CN | 217639769 U | 10/2022 |
| CN | 217639770 U | 10/2022 |
| CN | 217639771 U | 10/2022 |
| CN | 217639772 U | 10/2022 |
| CN | 217639773 U | 10/2022 |
| CN | 217639774 U | 10/2022 |
| CN | 217639776 U | 10/2022 |
| CN | 217639777 U | 10/2022 |
| CN | 217639778 U | 10/2022 |
| CN | 217639903 U | 10/2022 |
| CN | 217639920 U | 10/2022 |
| CN | 115268058 A | 11/2022 |
| CN | 115327865 A | 11/2022 |
| CN | 115332917 A | 11/2022 |
| CN | 115343795 A | 11/2022 |
| CN | 115390176 A | 11/2022 |
| CN | 217809433 U | 11/2022 |
| CN | 217818613 U | 11/2022 |
| CN | 217819022 U | 11/2022 |
| CN | 217820828 U | 11/2022 |
| CN | 217820829 U | 11/2022 |
| CN | 217820831 U | 11/2022 |
| CN | 217820834 U | 11/2022 |
| CN | 217820838 U | 11/2022 |
| CN | 217820839 U | 11/2022 |
| CN | 217820840 U | 11/2022 |
| CN | 217820943 U | 11/2022 |
| CN | 217820944 U | 11/2022 |
| CN | 217820945 U | 11/2022 |
| CN | 217820971 U | 11/2022 |
| CN | 217821058 U | 11/2022 |
| CN | 217821068 U | 11/2022 |
| CN | 217821071 U | 11/2022 |
| CN | 217821091 U | 11/2022 |
| CN | 217821110 U | 11/2022 |
| CN | 217821111 U | 11/2022 |
| CN | 217821113 U | 11/2022 |
| CN | 217821122 U | 11/2022 |
| CN | 217821160 U | 11/2022 |
| CN | 217821236 U | 11/2022 |
| CN | 217821680 U | 11/2022 |
| CN | 217821696 U | 11/2022 |
| CN | 217822825 U | 11/2022 |
| CN | 217823690 U | 11/2022 |
| CN | 217825178 U | 11/2022 |
| CN | 217885960 U | 11/2022 |
| CN | 217902220 U | 11/2022 |
| CN | 217902222 U | 11/2022 |
| CN | 115421295 A | 12/2022 |
| CN | 115453754 A | 12/2022 |
| CN | 115524768 A | 12/2022 |
| CN | 115524775 A | 12/2022 |
| CN | 115524874 A | 12/2022 |
| CN | 217981833 U | 12/2022 |
| CN | 217981857 U | 12/2022 |
| CN | 217981991 U | 12/2022 |
| CN | 217981992 U | 12/2022 |
| CN | 217982020 U | 12/2022 |
| CN | 217982038 U | 12/2022 |
| CN | 217982089 U | 12/2022 |
| CN | 217982120 U | 12/2022 |
| CN | 217983382 U | 12/2022 |
| CN | 217984044 U | 12/2022 |

(56) References Cited

FOREIGN PATENT DOCUMENTS

| | | |
|---|---|---|
| DE | 102007058558 A1 | 6/2009 |
| DE | 102009037629 A1 | 2/2011 |
| DE | 102012212753 A1 | 1/2014 |
| DE | 102015221985 A1 | 5/2017 |
| DE | 102016218996 A1 | 9/2017 |
| DE | 112018002811 T5 | 2/2020 |
| DE | 112018002670 T5 | 3/2020 |
| EP | 1251397 A2 | 10/2002 |
| EP | 1252623 B1 | 10/2004 |
| EP | 2763519 A2 | 8/2014 |
| EP | 2338114 B1 | 3/2017 |
| EP | 3226042 A1 | 10/2017 |
| EP | 3353578 A1 | 8/2018 |
| EP | 3380876 A1 | 10/2018 |
| EP | 3385770 A1 | 10/2018 |
| EP | 3440484 A1 | 2/2019 |
| EP | 3504566 A2 | 7/2019 |
| EP | 3631533 A1 | 4/2020 |
| EP | 3676973 A1 | 7/2020 |
| EP | 3743764 A1 | 12/2020 |
| EP | 3799626 A1 | 4/2021 |
| EP | 4004608 A1 | 6/2022 |
| GB | 2490895 A | 11/2012 |
| GB | 2499869 B | 3/2018 |
| GB | 2578049 A | 4/2020 |
| GB | 2578233 A | 4/2020 |
| GB | 2578236 A | 4/2020 |
| GB | 2578236 B | 11/2022 |
| HK | 40010538 | 7/2020 |
| JP | 2004302457 A | 10/2004 |
| JP | 2005017408 A | 1/2005 |
| JP | 2005274847 A | 10/2005 |
| JP | 2008046428 A | 2/2008 |
| JP | 2008299084 A | 12/2008 |
| JP | 2010085977 A | 4/2010 |
| JP | 2015502581 A | 1/2015 |
| JP | 2015092234 A | 5/2015 |
| JP | 2016511936 A | 4/2016 |
| JP | 2017062373 A | 3/2017 |
| JP | 2018536204 A | 12/2018 |
| JP | 2018537804 A | 12/2018 |
| JP | 2019516128 A | 6/2019 |
| JP | 2020522009 A | 7/2020 |
| JP | 2022542172 A | 9/2022 |
| KR | 20080099452 A | 11/2008 |
| KR | 20080103149 A | 11/2008 |
| KR | 20090002583 A | 1/2009 |
| KR | 20100027995 A | 3/2010 |
| KR | 101493928 B1 | 3/2015 |
| KR | 20150113041 A | 10/2015 |
| KR | 20170015109 A | 2/2017 |
| KR | 20180083885 A | 7/2018 |
| KR | 20180121309 A | 11/2018 |
| KR | 20180124106 A | 11/2018 |
| KR | 101905444 B1 | 12/2018 |
| KR | 20190038221 A | 4/2019 |
| KR | 102036640 B1 | 10/2019 |
| KR | 1020200008630 A | 1/2020 |
| KR | 1020200108901 A | 9/2020 |
| KR | 20210088520 A | 7/2021 |
| KR | 10-2363805 B1 | 2/2022 |
| KR | 1020220035971 A | 3/2022 |
| SG | 11201804346 P | 6/2018 |
| SG | 11201808772 W | 11/2021 |
| SG | 11202001717 | 2/2023 |
| SG | 11202013228 | 2/2024 |
| TW | 201017338 A | 5/2010 |
| TW | 201438242 A | 10/2014 |
| TW | 201908232 A | 3/2019 |
| WO | 0043750 A2 | 7/2000 |
| WO | 2007141788 A2 | 12/2007 |
| WO | 2009067540 A1 | 5/2009 |
| WO | 2009124181 A2 | 10/2009 |
| WO | 2011106553 A2 | 9/2011 |
| WO | 2011106553 A3 | 1/2012 |
| WO | 2012122677 A1 | 9/2012 |
| WO | 2012139634 A1 | 10/2012 |
| WO | 2012144997 A1 | 10/2012 |
| WO | 2012172366 A1 | 12/2012 |
| WO | 2013033591 A1 | 3/2013 |
| WO | 2014116500 A1 | 7/2014 |
| WO | 2015021255 A1 | 2/2015 |
| WO | 2015077926 A1 | 6/2015 |
| WO | 2015112939 A1 | 7/2015 |
| WO | 2016049629 A1 | 3/2016 |
| WO | 2016051325 A1 | 4/2016 |
| WO | 2016086204 A1 | 6/2016 |
| WO | 2016140720 A2 | 9/2016 |
| WO | 2016140720 A3 | 10/2016 |
| WO | 2016168173 A1 | 10/2016 |
| WO | 2016178740 A1 | 11/2016 |
| WO | 2016191142 A2 | 12/2016 |
| WO | 2017005709 A1 | 1/2017 |
| WO | 2017034995 A1 | 3/2017 |
| WO | 2017040854 A1 | 3/2017 |
| WO | 2017053309 A1 | 3/2017 |
| WO | 2017079480 A1 | 5/2017 |
| WO | 2017091738 A1 | 6/2017 |
| WO | 2017176921 A1 | 10/2017 |
| WO | 2017182771 A1 | 10/2017 |
| WO | 2018063455 A1 | 4/2018 |
| WO | 2018067246 A2 | 4/2018 |
| WO | 2018063455 A9 | 5/2018 |
| WO | 2018118984 A1 | 6/2018 |
| WO | 2018134215 A1 | 7/2018 |
| WO | 2018067246 A3 | 8/2018 |
| WO | 2018142339 A1 | 8/2018 |
| WO | 2018204856 A1 | 11/2018 |
| WO | 2018218063 A1 | 11/2018 |
| WO | 2018219710 A1 | 12/2018 |
| WO | 2018222944 A1 | 12/2018 |
| WO | 2019015735 A1 | 1/2019 |
| WO | 2019039241 A1 | 2/2019 |
| WO | 2019043016 A1 | 3/2019 |
| WO | 2019046827 A1 | 3/2019 |
| WO | 2019057907 A1 | 3/2019 |
| WO | 2019075335 A1 | 4/2019 |
| WO | 2019101750 A2 | 5/2019 |
| WO | 2019103762 A2 | 5/2019 |
| WO | 2019108290 A1 | 6/2019 |
| WO | 2019113106 A1 | 6/2019 |
| WO | 2019116364 A1 | 6/2019 |
| WO | 2019118646 A1 | 6/2019 |
| WO | 2019119025 A1 | 6/2019 |
| WO | 2019103762 A3 | 7/2019 |
| WO | 2019136166 A1 | 7/2019 |
| WO | 2019103762 A9 | 8/2019 |
| WO | 2019147828 A1 | 8/2019 |
| WO | 2019148200 A1 | 8/2019 |
| WO | 2019164542 A1 | 8/2019 |
| WO | 2019164849 A1 | 8/2019 |
| WO | 2019173357 A1 | 9/2019 |
| WO | 2019198568 A1 | 10/2019 |
| WO | 2019203876 A2 | 10/2019 |
| WO | 2019204667 A1 | 10/2019 |
| WO | 2019206430 A1 | 10/2019 |
| WO | 2020001938 A1 | 1/2020 |
| WO | 2020010084 A1 | 1/2020 |
| WO | 2020214617 A1 | 10/2020 |
| WO | 2021021671 A1 | 2/2021 |
| WO | 2021130085 A1 | 7/2021 |
| WO | 2021230868 A1 | 11/2021 |

OTHER PUBLICATIONS

Kats et al., "Giant birefringence in optical antenna arrays with widely tailorable optical anisotropy", PNAS, Jul. 31, 2012, vol. 109, No. 31, pp. 12364-12368, www.pnas.org/dgi/doi/10.1073/pnas.1210686109.

Khorasaninejad et al., "Visible Wavelength Planar Metalenses Based on Titanium Dioxide", IEEE Journal of Selected Topics in Quantum Electronics, May/Jun. 2017, vol. 23, No. 3, pp. 43-58.

(56) References Cited

OTHER PUBLICATIONS

Khorasaninejad et al., "Achromatic Metalens over 60 nm Bandwidth in the Visible and Metalens with Reverse Chromatic Dispersion", Nano Letters, Jan. 26, 2017, vol. 17, No. 3, pp. 1819-1824, doi: 10.1021/acs.nanolett.6b05137.

Khorasaninejad et al., "Achromatic Metasurface Lens at Telecommunication Wavelengths", Nanno Letters, Jul. 13, 2015, vol. 15, No. 8, pp. 5358-5362, doi: 10.1021/acs.nanolett.5b01727.

Khorasaninejad et al., "Broadband and chiral binary dielectric meta-holograms", Science Advances, May 13, 2016, vol. 2, No. 5, 6 pgs., doi:10.1126/sciadv.1501258.

Khorasaninejad et al., "Broadband Multifunctional Efficient Meta-Gratings Based on Dielectric Waveguide Phase Shifters", Nano Letters, Sep. 15, 2015, vol. 15, No. 10, pp. 6709-6715, doi: 10.1021/acs.nanolett.5b02524.

Khorasaninejad et al., "Metalenses at Visible Wavelengths: Diffraction-Limited Focusing and Subwavelength Resolution Imaging", Science, vol. 352, No. 6290, Jun. 3, 2016, pp. 1190-1194, doi: 10.1126/science.aaf6644.

Khorasaninejad et al., "Multispectral Chiral Imaging with a Metalens", Nano Letters, Jun. 7, 2016, vol. 16, pp. 4595-4600, doi: 10.1021/acs.nanolett.6b01897.

Khorasaninejad et al., "Planar Lenses at Visible Wavelengths", Arxiv, May 7, 2016, 17 pages.

Khorasaninejad et al., "Polarization-Insensitive Metalenses at Visible Wavelengths", Nano Letters, Oct. 24, 2016, vol. 16, No. 11, pp. 7229-7234, doi: 10.1021/acs.nanolett.6b03626.

Khorasaninejad et al., "Super-Dispersive Off-Axis Meta-Lenses for Compact High Resolution Spectroscopy", Nano Letters, Apr. 27, 2016, vol. 16, No. 6, pp. 3732-3737, doi: 10.1021/acs.nanolett.6b01097.

Kildishev et al., "Planar Photonics with Metasurfaces", Science, vol. 339, No. 6125, Mar. 15, 2013, pp. 1232009-1-1232009-6, DOI: 10.1126.science.1232009.

Kominami et al., "Dipole and Slot Elements and Arrays on Semi-Infinite Substrates", IEEE Transactions on Antennas and Propagation, Jun. 1985, vol. AP33, No. 6, pp. 600-607.

Krasnok et al., "All-dielectric optical nanoantennas", Optics Express, Aug. 23, 2012, vol. 20, No. 18, pp. 20599-20604.

Kress et al., "Applied Digital Optics from Micro-Optics to Nanophotonics", Applied Digital Optics, 2009, Wiley, 30 pgs.

Lalanne et al., "Interaction between optical nano-objects at metallodielectric interfaces", Nature Physics, Aug. 2006, vol. 2. pp. 551-556, doi:10.1038/nphys364.

Leveque et al., "Transient behavior of surface plasmon polaritons scattered at a subwavelength groove", Physical Reviews B, 76, Oct. 18, 2007, pp. 155418-1-155418-8, DOI: 10.1103/PhysRevB.76.155418.

Lezec et al., "Beaming Light from a Subwavelength Aperture", Science Express, Aug. 2, 2002, vol. 297, pp. 820-822, doi:10.1126/science.1071895.

Li et al., "Achromatic Flat Optical Components via Compensation between Structure and Material Dispersions.", Scientific Reports, 2016, vol. 6, No. 19885, 7 pgs., DOI:10.1038/srep19885.

Li et al., "Flat metasurfaces to focus electromagnetic waves in reflection geometry", Optics Letters, 2012, vol. 37, No. 23, pp. 4940-4942.

Lin et al., "Dielectric Gradient Metasurface Optical Elements", Science, Jul. 18, 2014, vol. 345, Issue 6194, pp. 298-302, DOI:10.1126/science.1253213.

Liu et al., "Realization of polarization evolution on higher-order Poincare sphere with metasurface", Applied Physics Letters, 2014, vol. 104, pp. 191110-1-191101-4, http://dx.doi.org/10.1063/1.4878409.

Lo et al., "New Architecture for Space Telescopes Uses Fresnel Lenses", SPIE Newsroom, Aug. 9, 2006, 2 pgs., doi: 10.1117/2.1200608.0333.

Lu et al., "Planar high-numerical-aperture low-loss focusing reflectors and lenses using subwavelength high contrast gratings", Optics Express, Jun. 7, 2010, vol. 18, No. 12, pp. 12606-12614, doi: 10.1364/OE.18.012606.

Luk et al., "Dielectric Resonator Antennas", Research Studies Press Ltd, Hertfordshire, 2003, 404 pgs. (presented in two parts).

Mao et al., "Nanopatterning Using a Simple Bi-Layer Lift-Off Process for the Fabrication of a Photonic Crystal Nanostructure", Nanotechnology, Feb. 1, 2013, vol. 24, No. 8, 6 pgs., doi:10.1088/0957-4484/24/8/085302.

Mao et al., "Surface Patterning of Nonscattering Phosphors for Light Extraction", Optics Letters, Aug. 1, 2013, vol. 38, No. 15, pp. 2796-2799, doi: 10.1364/OL.38.002796.

Martin-Moreno, "Theory of highly directional emission from a single sub-wavelength aperture surrounded by surface corrugations", Physical Review Letters, Apr. 25, 2003, vol. 90, No. 16, 167401, pp. 167401-1-167401-4, published online Apr. 23, 2003, doi:10.1103/PnysRevLett.9.167401.

Mcleod, "Thin-Film Optical Filters", Adam Hilger, 1986, 667 pgs. (presented in three parts).

Miyazaki et al., "Ultraviolet-Nanoimprinted Packaged Metasurface Thermal Emitters for Infrared CO2 Sensing", Science and Technology of Advanced Materials, Published May 20, 2015, vol. 16, No. 3, 5 pgs., doi: 10.1088/1468-6996/16/3/035005.

Monticone et al., "Full Control of Nanoscale Optical Transmission with a Composite Metascreen", Physical Review Letters, May 17, 2013, vol. 110, pp. 203903-1-203903-5, DOI: 10.1103/PhysRevLett.110.203903.

Mueller et al., "Metasurface Polarization Optics: Independent Phase Control of Arbitrary Orthogonal States of Polarization", Physical Review Letters, Mar. 17, 2017, vol. 118, 113901, 5 pgs.

Ni et al., "Broadband Light Bending with Plasmonic Nanoantennas", Science, Jan. 27, 2012, vol. 335, Issue 6067, 3 pgs., published online Dec. 22, 2011, DOI: 10.1126/science.1214686.

Ni et al., "Ultra-thin, planar, Babinet-inverted plasmonic metalenses", Light Science & Applications, 2013, vol. 2, e72, pp. 1-6, published online Apr. 26, 2013, doi:10.1038/lsa.2013.28.

Okaya et al., "The Dielectric Microwave Resonator", Proceedings of the IRE, Oct. 1962, vol. 50, Issue 10, pp. 2081-2092, DOI: 10.1109/JRPROC.1962.288245.

Pacheco-Peña et al., "Epsilon-near-zero metalenses operating in the visible", Optics & Laser Technology, Jan. 19, 2016, 80, 18 pgs.

Peinado et al., "Optimization and performance criteria of a Stokes polarimeter based on two variable retarders", Optics Express, Apr. 12, 2010, vol. 18, No. 8, pp. 9815-9530.

Petosa et al., "An Overview of Tuning Techniques for Frequency-Agile Antennas", IEEE Antennas and Propagation Magazine, Oct. 2012, vol. 52, pp. 5, pp. 271-296.

Pfeiffer et al., "Metamaterial Huygens' Surface: Tailoring Wave Fronts with Reflectionless Sheets", Physical Review Letters, May 10, 2013, vol. 110, pp. 197401-1-197401-5. DOI: 10.1103/PhysRevLett.110.197401.

Pors et al, "Broadband Focusing Flat Mirrors Based on Plasmonic Gradient Metasurfaces", Nano Letters, Jan. 23, 2013, vol. 13, No. 2, pp. 829-834, https://doi.org/10.1021/nl304761m.

Reichelt et al., "Capabilities of diffractive optical elements for real-time holographic displays", Proceedings of SPIE, Feb. 2008, vol. 6912, pp. 69120-69130, pttp://dx.doi.org/10.1117/12.762887.

Rubin et al., "Polarization State Generation and Measurement with a Single Metasurface", Optics Express, Aug. 20, 2018, vol. 26, Issue No. 17, pp. 21455-21478, XP055750318, DOI: 10.1364/0E.26.021455.

Saeidi et al., "Wideband plasmonic focusing metasurfaces", Applied Physics Letters, Aug. 2014, vol. 105, pp. 053107-1-053107-4, http://dx.doi.org/10.1063/1.4892560.

Sales et al., "Diffractive-Refractive Behavior of Kinoform Lenses", Applied Optics, Jan. 1, 1997, vol. 36, pp. 253-257, No. 1, doi: 10.1364/AO.36.000253.

Sancho-Parramon et al., "Optical characterization of HfO2 by spectroscopic ellipsometry: dispersion models and direct data inversion", Thin Solid Films, 2008, vol. 516, pp. 7990-7995, available online Apr. 10, 2008, doi:10.1016/j.tsf.2008.04.007.

(56) References Cited

OTHER PUBLICATIONS

She et al., "Large area metalenses: design, characterization, and mass manufacturing", Optics Express, Jan. 22, 2018, vol. 26, No. 2, pp. 1573-1585, doi: 10.1364/OE.26.001573.
Sun et al., "High-Efficiency Broadband anomalous Reflection by Gradient Meta-Surfaces", Nano Letters, 2012, vol. 12, No. 12, pp. 6223-6229, dx.doi.org/10.1021/nl3032668.
Vo et al., "Sub-wavelength grating lenses with a twist", IEEE Photonics Technology Letters, Jul. 1, 2014, vol. 26, No. 13, pp. 1375-1378, DOI: 10.1109/LPT.2014.2325947.
Walther et al., "Spatial and Spectral Light Shaping with Metamaterials", Advanced Materials, 2012, vol. 24, pp. 6300-6304, doi: 10.1002/adma.201202540.
Wang et al., "Generation of steep phase anisotropy with zero-backscattering by arrays of coupled dielectric nano-resonators", Applied Physics Letters, 2014, vol. 105, pp. 121112-1-121112-5, published online Sep. 25, 2014, https://doi.org/10.1063/1.4896631.
Wu et al., "Spectrally selective chiral silicon metasurfaces based on infrared Fano resonances", Nature Communications, 2014, vol. 5, No. 3892, published online May 27, 2014, 9 pgs., DOI: 10.1038/ncomms4892.
Yang et al., "Design of ultrathin plasmonic quarter-wave plate based on period coupling", Optics Letters, 2013, vol. 38, No. 5, pp. 679-681, https://doi.org/10.1364/OL.38.000679.
Yao et al., "Wide Wavelength Tuning of Optical Antennas on Graphene with Nanosecond Response Time", Nano Letters, 2014, First Published Dec. 3, 2013, vol. 14, No. 1, pp. 214-219, doi: 10.1021/nl403751p.
Yu et al., "A Broadband, Background-Free Quarter-Wave Plate Based on Plasmonic Metasurfaces", Nano Letters, Nov. 3, 2012, vol. 12, No. 12, pp. 6328-6333, dx.doi.org/10.1021/nl303445u.
Yu et al., "Flat optics with designer metasurfaces", Nature Materials, vol. 13, Feb. 2014, published online Jan. 23, 2014, pp. 139-150, DOI:10.1038/NMAT3839.
Yu et al., "Flat optics: Controlling wavefronts with optical antenna metasurfaces", IEEE Journal of Selected Topics, 2013, vol. 19, No. 3, 23 pgs.
Yu et al., "Light Propagation with Phase Discontinuities: Generalized Laws of Reflection and Refraction", Science, vol. 334, No. 6054, Oct. 21, 2011, pp. 333-337, doi: 10.1126/science.1210713.
Yu et al., "Quantum cascade lasers with integrated plasmonic antenna-array collimators", Optics Express, Nov. 24, 2008, vol. 16, No. 24, pp. 19447-19461, published online Nov. 10, 2008.
Yu et al., "Small divergence edge-emitting semiconductor lasers with two-dimensional plasmonic collimators", Applied Physics Letters, 2008, vol. 93, pp. 181101-1-181101-3, doi: 10.1063/1.3009599.
Yu et al., "Small-divergence semiconductor lasers by plasmonic collimation", Nature Photonics, Sep. 2008, vol. 2, pp. 564-570, doi:10.1038/nphoton.2008.052.
Zhao et al., "Mie resonance-based dielectric metamaterials", Materials Today, Dec. 2009, vol. 12, No. 12, pp. 60-69.
Zhao et al., "Twisted Optical metamaterials or planarized ultrathin broadband circular polarizers", Nature Communications, 2012, vol. 3, No. 870, pp. 1-7, DOI: 10.1038/ncomms1877.
Zhou et al., "Characteristic Analysis of Compact Spectrometer Based on Off-Axis Meta-Lens", Applied Sciences, 2018, vol. 8, vol. 321, doi:10.3390/app8030321, 11 pgs.
Zhou et al., "Plasmonic holographic imaging with V-shaped nanoantenna array", Optics Express, Feb. 25, 2013, vol. 21, No. 4, pp. 4348-4354, published online Feb. 12, 2013.
Zhu et al., "Ultra-compact visible chiral spectrometer with meta-lenses", APL Photonics, Feb. 7, 2017, vol. 2, pp. 036103-1-036103-12, 13 pgs., doi: 10.1063/1.4974259.
Zou et al., "Dielectric resonator nanoantennas at visible frequencies", Optics Express, Jan. 14, 2013, vol. 21, No. 1, pp. 1344-1352, published online Jan. 11, 2013.
Extended European Search Report for European Application 17858861.2, Report Completed Mar. 13, 2020, Mailed Mar. 23, 2020, 9 Pgs.
Extended European Search Report for European Application No. 19830958.5, Search completed Feb. 17, 2022, Mailed Feb. 25, 2022, 8 Pgs.
Extended European Search Report for European Application No. 17779772.7, Search completed Oct. 15, 2019, Mailed Oct. 25, 2019, 10 Pgs.
Extended European Search Report for European Application No. 16869282.0, Search completed Nov. 8, 2019, Mailed Nov. 20, 2019, 15 Pgs.
Search Report and Written Opinion for International Application No. 11201808772W, Search completed Jan. 20, 2020, Mailed Jan. 28, 2020, 12 Pgs.
Supplementary Partial European Search Report for European Application No. 16869282.0, Search completed Jun. 19, 2019, Mailed Jul. 2, 2019, 12 Pgs.
International Preliminary Report on Patentability for International Application PCT/US2018/049276, Report issued on Mar. 3, 2020, Mailed on Mar. 12, 2020, 8 Pgs.
International Preliminary Report on Patentability for International Application PCT/US2019/040302, Report issued Jan. 5, 2021, Mailed Jan. 14, 2021, 5 Pgs.
International Preliminary Report on Patentability for International Application No. PCT/US2018/038357, Report issued Dec. 24, 2019, Mailed Jan. 2, 2020, 6 Pgs.
International Preliminary Report on Patentability for International Application No. PCT/US2012/053434, Report issued Mar. 4, 2014, Mailed Mar. 13, 2014, 6 Pgs.
International Preliminary Report on Patentability for International Application No. PCT/US2015/064930, Report issued Jun. 13, 2017, Mailed Jun. 22, 2017, 8 Pgs.
International Preliminary Report on Patentability for International Application No. PCT/US2016/063617, Report issued May 29, 2018, Mailed Jun. 7, 2018, 6 Pgs.
International Preliminary Report on Patentability for International Application No. PCT/US2017/026206, Report issued Oct. 9, 2018, Mailed Oct. 18, 2018, 8 Pgs.
International Preliminary Report on Patentability for International Application No. PCT/US2018/031204, Report issued Nov. 5, 2019, Mailed Nov. 14, 2019, 8 Pgs.
International Preliminary Report on Patentability for International Application No. PCT/US2018/035502, Report issued Dec. 3, 2019, Mailed Dec. 12, 2019, 7 Pgs.
International Preliminary Report on Patentability for International Application No. PCT/US2018/046947, Issued Feb. 18, 2020, mailed on Feb. 27, 2020, 6 Pgs.
International Preliminary Report on Patentability for International Application PCT/US2008/084068, Report issued on May 25, 2010, 5 Pgs.
International Preliminary Report on Patentability for International Application PCT/US2016/052685, Report issued Mar. 27, 2018, Mailed Apr. 5, 2018, 8 Pgs.
International Preliminary Report on Patentability for International Application PCT/US2017/036897, Report issued Dec. 11, 2018, Mailed Dec. 20, 2018, 8 Pgs.
International Preliminary Report on Patentability for International Application PCT/US2017/048469, Report issued Feb. 26, 2019, Mailed Mar. 7, 2019, 5 Pgs.
International Preliminary Report on Patentability for International Application PCT/US2018/034460, Report issued Nov. 26, 2019, Mailed Dec. 5, 2019, 6 Pgs.
International Search Report and Written Opinion for International Application No. PCT/US2012/053434, Search completed Oct. 17, 2012, Mailed Dec. 17, 2012, 7 Pgs.
International Search Report and Written Opinion for International Application No. PCT/US2019/014975, Search completed Jun. 17, 2019, Mailed Jul. 8, 2019, 10 pgs.
International Search Report and Written Opinion for International Application No. PCT/US2019/018615, Search completed Apr. 12, 2019, Mailed May 6, 2019, 12 Pgs.
International Search Report and Written Opinion for International Application No. PCT/US2019/040302, completed Aug. 29, 2019, Mailed Oct. 17, 2019, 6 Pgs.

(56) References Cited

OTHER PUBLICATIONS

International Search Report and Written Opinion for International Application No. PCT/US2020/043600, Search completed Sep. 29, 2020, Mailed Nov. 24, 2020, 11 Pgs.
International Search Report and Written Opinion for International Application No. PCT/US2008/084068, Completed Jan. 13, 2009, Mailed Feb. 2, 2009, 6 pgs.
International Search Report and Written Opinion for International Application No. PCT/US2015/064930, Search completed Sep. 9, 2016, Mailed Sep. 20, 2016, 11 Pgs.
International Search Report and Written Opinion for International Application No. PCT/US2016/052685, Search completed Nov. 30, 2016, Mailed Dec. 9, 2016, 12 Pgs.
International Search Report and Written Opinion for International Application No. PCT/US2016/063617, Search completed Jan. 19, 2017, Mailed Mar. 31, 2017, 9 Pgs.
International Search Report and Written Opinion for International Application No. PCT/US2017/026206, Search completed Jun. 10, 2017, Mailed Jun. 28, 2017, 11 Pgs.
International Search Report and Written Opinion for International Application No. PCT/US2017/036897, Search completed Jan. 31, 2018, Mailed Feb. 21, 2018, 9 Pgs.
International Search Report and Written Opinion for International Application No. PCT/US2017/048469, Search completed Apr. 20, 2018, Mailed May 4, 2018, 9 Pgs.
International Search Report and Written Opinion for International Application No. PCT/US2018/031204, Search completed Jun. 29, 2018, Mailed Jul. 23, 2018, 14 Pgs.
International Search Report and Written Opinion for International Application No. PCT/US2018/034460, Search completed Jul. 29, 2018, Mailed Aug. 24, 2018, 10 Pgs.
International Search Report and Written Opinion for International Application No. PCT/US2018/035502, Search completed Jul. 31, 2018, Mailed Aug. 24, 2018, 13 Pgs.
International Search Report and Written Opinion for International Application No. PCT/US2018/038357, Search completed Apr. 9, 2019, Mailed May 13, 2019, 12 Pgs.
International Search Report and Written Opinion for International Application No. PCT/US2018/046947, Search completed Oct. 14, 2019, Mailed Oct. 25, 2019, 10 Pgs.
International Search Report and Written Opinion for International Application No. PCT/US2018/049276, Search completed Oct. 26, 2018, Mailed Jan. 15, 2019, 12 Pgs.
"Materials for High and Low Refractive Index Coatings", 2019, Sigma-Aldrich tech. www.sigmaaldrich.com/materials-science/organic-electronics/ri-coatings.html (3 pages).
"These Tiny, Incredible 'Metalenses' are the Next Giant Leap in Optics", PetaPixel, Jun. 3, 2016, 21 pgs.
Aieta et al., "Aberration-Free Ultrathin Flat Lenses and Axicons at Telecom Wavelengths Based on Plasmonic Metasurfaces", Nano Lett., Web publication date Aug. 15, 2012, vol. 12, No. 9, pp. 4932-4936.
Aieta et al., "Aberrations of flat lenses and aplanatic metasurfaces", Optics Express, Dec. 16, 2013, vol. 21, No. 25, pp. 31530-31539, doi: 10.1364/oe.21.031530.
Aieta et al., "Multiwavelength Achromatic Metasurfaces by Dispersive Phase Compensation", Sciences, Harvard University, Cambridge, MA 02138, USA, Mar. 20, 2015, vol. 347, No. 6228, pp. 1342-1345, doi: 10.1126/science.aaa2494.
Aieta et al., "Out-of-Plane Reflection and Refraction of Light by Anisotropic Optical Antenna Metasurfaces with Phase Discontinuities", Nano Letters,Feb. 15, 2012, vol. 12, No. 3, pp. 1702-1706, doi: 10.1021/nl300204s.
Arbabi et al., "Dielectric Metasurfaces for Complete Control of Phase and Polarization with Subwavelength Spatial Resolution and High Transmission", Nature Nanotechnology, Aug. 31, 2015, 27 pgs., doi:10.1038/nnano.2015.186.
Arbabi et al., "Miniature Optical Planar Camera Based on a Wide-Angle Metasurface Doublet Corrected for Monochromatic Aberrations", Nature Communications, Nov. 28, 2016, vol. 7, Article No. 13682, 9 pgs., doi:10.1038/ncomms13682.
Arbabi et al., "Subwavelength-Thick Lenses with High Numerical Apertures and Large Efficiency Based on High-Contrast Transmitarrays", Nature Communications, May 5, 2015, vol. 6, pp. 7069, doi:10.1038/ncomms8069.
Arbabi et al., "Supplementary Figures of Miniature Optical Planar Camera Based on a Wide-Angle Metasurface Doublet Corrected for Monochromatic Aberrations", Nature Communications, 2016 vol. 7, Article No. 13682.
Azadegan et al., "A novel approach for miniaturization of slot antennas", IEEE Transactions on Antennas and Propagation, Mar. 2003, vol. 51, No. 3, pp. 421-429, doi:10.1109/TAP.2003.809853.
Blanchard et al., "Modeling nanoscale, V-shaped antennas for the design of optical phased arrays", Physical Review, Apr. 30, 2012, vol. B 85, pp. 155457-1-155457-11, DOI: 10.1103/physRevB.85.155457.
Buralli et al., "Optical Performance of Holographic Kinoforms", Applied Optics, Mar. 1, 1989, vol. 28, No. 5, pp. 976-983, doi: 10.1364/AO.28.000976.
Byrnes et al., "Designing Large, High-Efficiency, High-Numerical-Aperture, Transmissive Meta-Lenses for Visible Light", Optics Express, Mar. 7, 2016, vol. 24, No. 5, pp. 5110-5124, DOI:10.1364/OE.24.005110.
Campione et al., "Tailoring dielectric resonator geometrics for directional scattering and Huygens' metasurface", Optics Express, Feb. 9, 2015, vol. 23, Issue 3, published online Jan. 28, 2015, pp. 2293-2307, arXiv:1410.2315, DOI: 10.1364/OE.23.002293.
Chen et al., "A broadband achromatic metalens for focusing and imaging in the visible", Nature Nanotechnology, Jan. 1, 2018, vol. 13, pp. 220-226, doi: 10.1038/s41565-017-0034-6.
Chen et al., "A review of metasurfaces: physics and applications", Reports on Progress in Physics, Jun. 16, 2016, vol. 79, 076401, 40 pgs., doi: 10.1088/0034-4885/79/7/076401.
Chen et al., "Dual-polarity plasmonic metalens for visible light", Nature Communications, Nov. 13, 2012, vol. 3, No. 1198, pp. 1-6, DOI 10.10388/ncomms2207.
Chen et al., "Engineering the phase front of light with phase-change material based planar lenses", Sci Rep 5, 8660 (2015), Published Mar. 2, 2015, 7 pgs.
Chen et al., "High-Efficiency Broadband Meta-Hologram with Polarization-Controlled Dual Images", Nano Letters, 2014, vol. 14, No. 1, published online Dec. 13, 2013, pp. 225-230, https://doi.org.10.1021/nl403811d.
Chen et al., "Immersion Meta-Lenses at Visible Wavelengths for Nanoscale Imaging", Nano Letters, Apr. 7, 2017, vol. 17, No. 5, 7 pgs., doi: 10.1021/acs.nanolett.7b00717.
Chen et al., "Phase and dispersion engineering of metalenses: broadband achromatic focusing and imaging in the visible", Nov. 26, 2017. Cornell University. [retrieved on Apr. 11, 2019). Retrieved from the Internet: <URL:https://arxiv.org/abs/1711.09343v1 >. entire document, 30 pgs.
Chen et al., "Supplementary information of Engineering the phase front of light with phase-change material based planar lenses", Sci Rep 5, 8660 (2015), Published Mar. 2, 2015, 4 pgs.
Chou et al., "Imprint lithography with 25-nanometer resolution", Science, Apr. 5, 1996, vol. 272, Issue 5258, pp. 85-87.
Dayal et al., "Polarization control of 0.85μm vertical-cavity surface-emitting lasers integrated with gold nanorod arrays", Applied Physics Letters, 2007, vol. 91, pp. 111107-1-111107-3, published online Sep. 12, 2007, DOI: 10.1063/1.2783281.
Decker et al., "High-efficiency light-wave control with all-dielectric optical Huygens' metasurfaces", Advanced Optical Materials, arXiv:1405.5038, May 2014, pp. 813-820, doi:10.1002/adom.201400584.
Devlin et al., "Arbitrary spin-to-orbital angular momentum conversion of light", Science, vol. 358, Nov. 17, 2017, published online Nov. 2, 2017, pp. 896-901, DOI: 10.1126/science.aao5392.
Devlin et al., "Broadband high-efficiency dielectric metasurfaces for the visible spectrum", Proceedings of the National Academy of Sciences of USA, Sep. 20, 2016, vol. 113, No. 38, pp. 10473-10478, doi: 10.1073/pnas.1611740113.

(56) References Cited

OTHER PUBLICATIONS

Devlin et al., "High Efficiency Dielectric Metasurfaces at Visible Wavelengths", Retrieved from the Internet: URL: https://arxiv.org/ftp/arxiv/papers/1603/1603.02735.pdf, Mar. 8, 2016, 18 pgs.
Dong et al., "Zero-index photonic crystal as low-aberration optical lens (Conference Presentation)", Proc. SPIE 9918, Metamaterials, Metadevices, and Metasystems, Nov. 9, 2016, 991822, available at https://doi.org/10.1117/12.2237137, 1 pg.
Evlyukhin et al., "Optical response features of Si-nanoparticle arrays", Physical Review B, 2010, vol. 82, 045404-1-045404-11, DOI: 10.1103/PhysRevB.82.045404.
Fattal et al., "Flat dielectric grating reflectors with focusing abilities", Nature Photonics, May 2, 2010, vol. 4, No. 7, XP055162682, pp. 1-5, doi: 10.1038/nphoton.2010.116.
Genevet et al., "Breakthroughs in Photonics 2013: Flat Optics: Wavefronts Control with Huygens' Interfaces", IEEE Photonics Journal, Apr. 1, 2014, vol. 6, No. 2, pp. 1-4, XP011546594, doi: 10.1109/jphot.2014.2308194.
Genevet et al., "Recent advances in planar optics: from plasmonic to dielectric metasurfaces", Optica, Jan. 19, 2017, vol. 4, No. 1, pp. 139-152, doi: 10.1364/OPTICA.4.000139.
Goldberg, "Genetic Algorithms in Search, Optimization, and Machine Learning", Addison-Wesley, 1989, 432 pgs., (presented in two parts).
Groever et al., "Meta-Lens Doublet in the Visible Region", Nano Letters, Jun. 29, 2017, vol. 17, No. 8, pp. 4902-4907, doi: 10.1021/acs.nanolett.7b01888.
Hartwig et al., "Challenges for Reducing the Size of Laser Activated Remote Phosphor Light Engines for DLP Projection", Proceedings of SPIE, International Optical Design Conference, Dec. 17, 2014, vol. 9293, pp. 929313-1 to 929313-6, doi: 10.1117/12.2073275, ISBN: 978-1-62841-730-2.
Hidber et al., "Microcontact printing of Palladium colloids: micronscale patterning by electroless deposition of copper", 1996, Langmuir, The ACS Journal of Surfaces and Colloids, vol. 12, pp. 1375-1380.
Extended European Search Report for European Application No. 18805669.1, Search completed Feb. 9, 2021, Mailed Feb. 18, 2021, 13 pgs.
Extended European Search Report for European Application No. 18852460.7, Search completed Mar. 25, 2021, Mailed Apr. 6, 2021, 13 pgs.
International Preliminary Report on Patentability for International Application No. PCT/US2020/028159, Report issued Sep. 28, 2021, Mailed on Oct. 28, 2021, 7 pgs.
International Preliminary Report on Patentability for International Application No. PCT/US2020/043600, Report issued Feb. 1, 2022, Mailed on Feb. 10, 2022, 9 pgs.
International Search Report and Written Opinion for International Application No. PCT/US2020/028159, Search completed Jun. 15, 2020, Mailed Aug. 11, 2020, 7 pgs.
Arbabi et al., "Efficient Dielectric Metasurface Collimating Lenses for Mid-Infrared Quantum Cascade Lasers", Optics Express, vol. 23, No. 26, Dec. 28, 2015, pp. 33310-33317, doi: 10.1364/OE.23.033310.
Birch et al., "3D Imaging with Structured Illumination for Advanced Security Applications", Sandia Report, Sep. 2015, retrieved from the internet: URL: <https://www.osti.gov/biblio/1221516>, 64 pages, doi: 10.2172/1221516.
Chen et al., "Broadband Achromatic Metasurface-Refractive Optics", Nano Letters, vol. 18, Nov. 13, 2018, pp. 7801-7808.
Cumme et al., "From Regular Periodic Micro-Lens Arrays to Randomized Continuous Phase Profiles", Advanced Optical Technologies, vol. 4, No. 1, 2015, pp. 47-61.
Ding et al., "Gradient Metasurfaces: Fundamentals and Applications", ArXiv:1704:03032v1 [physics.optics], Apr. 10, 2017, 83 pgs.
Engelberg et al., "Near-IR Wide Field-of-View Huygens Metalens for Outdoor Imaging Applications", IEEE, Cleo, 2019, 2 pgs.
Herrera-Fernandez et al., "Double Diffractive Optical Element System for Near-Field Shaping", Applied Optics, vol. 50, No. 23, Aug. 10, 2011, pp. 4587-4593.

Horie et al., "Reflective Optical Phase Modulator Based on High-Contrast Grating Mirrors", Optical Society of America, IEEE, 2014, 2 pgs.
Hsiao et al., "Fundamentals and Applications of Metasurfaces", Small Methods, vol. 1, Mar. 24, 2017, pp. 1600064-1-1600064-20.
Jang et al., "Wavefront Shaping with Disorder-Engineered Metasurfaces", Nature Photonics, 2018, 8 pgs.
Karagodsky et al., "Monolithically Integrated Multi-Wavelength VCSEL Arrays Using High-Contrast Gratings", Optics Express, vol. 18, No. 2, Jan. 18, 2010, pp. 694-699, doi: https://doi.org/10.1364/OE.18.000694.
Khorasaninejad et al., "Silicon Nanofin Grating as a Miniature Chirality-Distinguishing Beam-Splitter", Nature Communications, vol. 5, No. 5386, Nov. 12, 2014, pp. 1-6, doi: 10.1038/ncomms6386.
Lee et al., "Giant Nonlinear Response from Plasmonic Metasurfaces Coupled to Intersubband Transitions", Nature, vol. 511, Jul. 3, 2014, pp. 65-69.
Li et al., "All-Silicon Nanorod-Based Dammann Gratings", Optics Letters, vol. 40, No. 18, Sep. 15, 2015, pp. 4285-4288.
Li et al., "Broadband Diodelike Asymmetric Transmission of Linearly Polarized Light in Ultrathin Hybrid Metamaterial", Applied Physics Letters, vol. 105, Nov. 19, 2014, pp. 201103-1-201103-5, doi: 10.1063/1.4902162.
Li et al., "Dispersion Controlling Meta-Lens at Visible Frequency", Optics Express, vol. 25, No. 18, Sep. 4, 2017, pp. 21419-21427.
Li et al., "Metalens-Based Miniaturized Optical Systems", Micromachines, May 8, 2019, vol. 10, No. 310, pp. 1-21, doi: 10.3390/mi10050310.
Liu et al., "Single-Pixel Computational Ghost Imaging with Helicity-Dependent Metasurface Hologram", Science Advances, vol. 3, No. E1701477, Sep. 8, 2017, pp. 1-6.
Mackus et al., "The Use of Atomic Layer Deposition in Advanced Nanopatterning", Nanoscale, vol. 6, Jul. 25, 2014, 10941-10960.
Meng et al., "A Novel Nanofabrication Technique of Silicon-Based Nanostructures", Nanoscale Research Letters vol. 11, No. 504, pp. 1-9, doi:10.1186/s11671-016-1702-4.
Orazbayev et al., "Tunable Beam Steering Enabled by Graphene Metamaterials", Optics Express, vol. 24, No. 8, pp. 8848-8861, doi: 10.1364/OE.24.008848.
Pfeiffer et al., "Cascaded Metasurfaces for Complete Phase and Polarization Control", Applied Physics Letters, vol. 102, Jun. 11, 2013, pp. 231116-1-231116-4, doi: 10.1063/1.4810873.
Redding et al., "Full-Field Interferometric Confocal Microscopy Using a VCSEL Array", Optics Letters, vol. 39, No. 15, Aug. 1, 2014 , 11 pgs.
Roy et al., "Sub-Wavelength Focusing Meta-Lens", Optics Express, vol. 21, No. 6, Mar. 25, 2013, pp. 7577-7582.
Sayyah et al., "Two-Dimensional Pseudo-Random Optical Phased Array Based on Tandem Optical Injection Locking of Vertical Cavity Surface Emitting Lasers", Optics Express vol. 23, No. 15, Jul. 27, 2015, pp. 19405-19416, doi: 10.1364/OE.23.0194051.
Schulz et al., "Quantifying the Impact of Proximity Error Correction on Plasmonic Metasurfaces", Optical Materials Express, vol. 5, No. 12, Dec. 1, 2015, pp. 2798-2803, doi: 10.1364/OME.5.002798.
Sell et al., "Periodic Dielectric Metasurfaces with High-Efficiency, Multiwavelength Functionalities", Advanced Optical Materials, 2017, 16 pages, doi: 10.1002/adom.201700645.
Seurin et al., "High-Efficiency VCSEL Arrays for Illumination and Sensing in Consumer Applications", Proceedings of SPIE, vol. 9766, 2016, pp. 97660D-1-97660D-9, doi: 10.1117/12.2213295.
Shim et al., "Hard-Tip, Soft-Spring Lithography", Nature, vol. 469, Jan. 27, 2011, pp. 516-521.
Silvestri et al., "Robust Design Procedure for Dielectric Resonator Metasurface Lens Array", Optics Express, vol. 24, No. 25, Dec. 12, 2016, pp. 29153-29169.
Song et al., "Vividly-Colored Silicon Metasurface Based on Collective Electric and Magnetic Resonances", IEEE, Jan. 11, 2016, 2 pgs.
Voelkel et al., "Laser Beam Homogenizing: Limitations and Constraints", DPIE, Europe, Optical Systems Design, 2008, 12 pgs.
Voelz, , "Chapter 6: Transmittance Functions, Lenses, and Gratings", pp. 89-111.

(56) References Cited

OTHER PUBLICATIONS

Wang et al., "Broadband Achromatic Optical Metasurface Devices", Nature Communications, vol. 8, No. 187, Aug. 4, 2017, pp. 1-9, doi: 10.1038/s41467-017-00166-7.
Wen et al., "Metasurface for Characterization of the Polarization State of Light", Optics Express, vol. 23, No. 8, 2015, pp. 10272-10281, DOI:10.1364/OE.23.010272.
Xu et al., "Metasurface External Cavity Laser", Applied Physics Letters, vol. 107, No. 221105, 2015, pp. 221105-1-221105-5, doi: 10.1063/1.4936887.
Yu et al., "Optical Metasurfaces and Prospect of their Applications Including Fiber Optics", Journal of Lightwave Technology, 2015, vol. 33, No. 12, pp. 2344-2358.
Zhao et al., "Recent Advances on Optical Metasurfaces", Journal of Optics, Institute of Physics Publishing, vol. 16, Issue 12, 2014, 14 pages, doi: 10.1088/2040489781/16/12/123001.
Zhao et al., "Tailoring the Dispersion of Plasmonic Nanorods to Realize Broadband Optical Meta-Waveplates", Nano Letter, vol. 13, Feb. 5, 2013, pp. 1086-1091, doi: dx.doi.org/10.1021/nl304392b.
Zhou et al., "Progress on Vertical-Cavity Surface-Emitting Laser Arrays for Infrared Illumination Applications", Proc. SPIE 9001, Vertical-Cavity Surface-Emitting Lasers XVIII, 90010E, Feb. 27, 2014, 11 pgs.

* cited by examiner

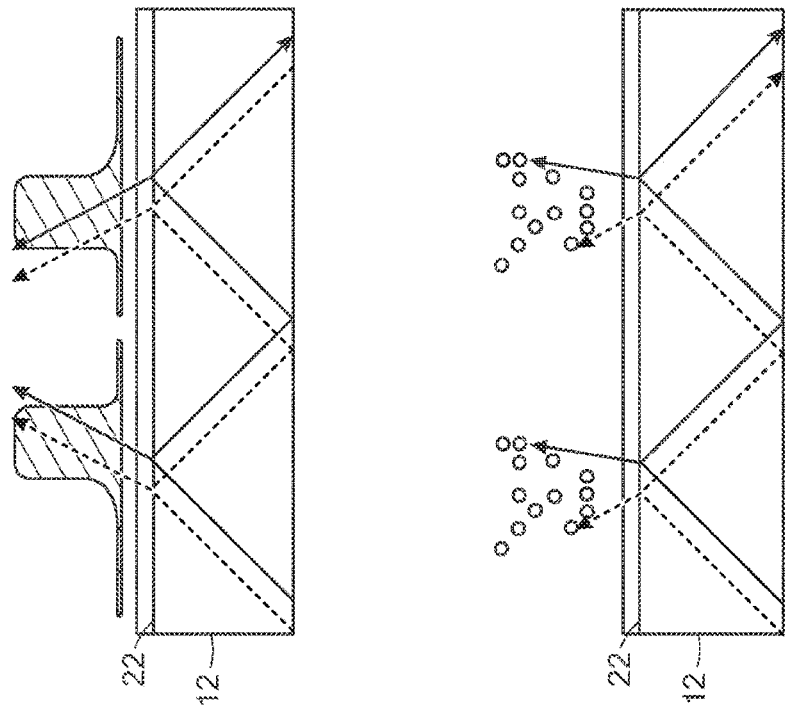
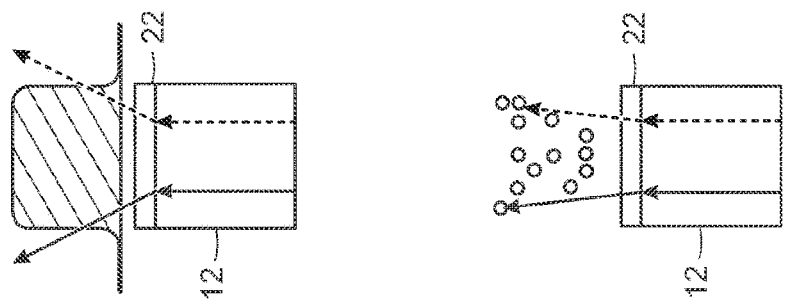
FIG. 3

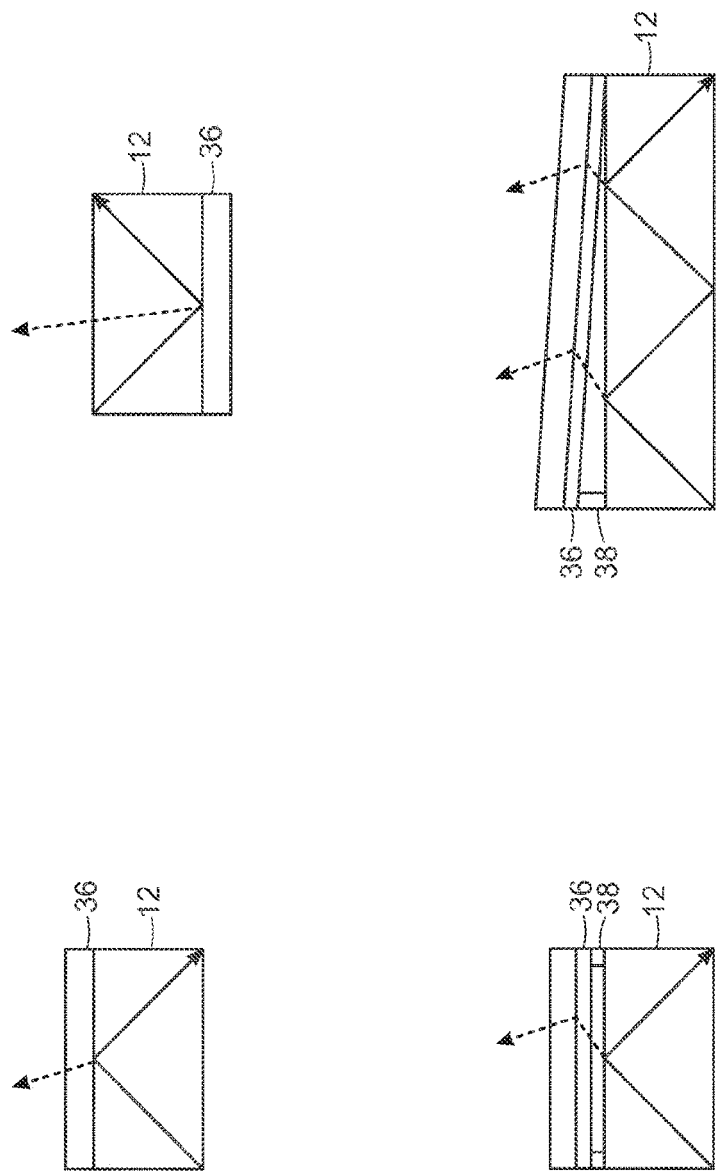

| Design | Number VCSELs | Dimensions VCSEL a | Dimensions Light Bar | Number Bar Illuminations | Total Dimensions | Illumination Ripple b |
|---|---|---|---|---|---|---|
| Single VCSEL | 1 | 100x100μm | No light bar | 0 | 1x1mm | 100% |
| VCSEL array* | 200 | 1x1mm | No light bar | 0 | 1x1mm | 7% |
| Single VCSEL with small bar | 1 | 100x100μm | 1x2x0.04mm | 20 | 1x2x1mm | 22% |
| VCSEL array* with small bar | 200 | 1x1mm | 1x2x0.4mm | 2 | 1x3x1mm | 5% |
| VCSEL array* with medium bar | 200 | 1x1mm | 1x3x0.4mm | 3 | 1x4x1mm | 4% |
| Narrow VCSEL array** with small bar | 100 | 1x0.25mm | 1x2x0.1mm | 8 | 1x2.25x1mm | 3% |
| Narrow VCSEL array** with med bar | 100 | 1x0.25mm | 1x3x0.1mm | 12 | 1x3.25x1mm | 2.8% |
| Narrow VCSEL array** with long bar | 100 | 1x0.25 | 1x25x0.1mm | 100 | 1x25x1mm | 1% | a The dimension is that of the VCSEL itself, the die may be bigger
b The actual illumination variation will be less than (estimated 50% of) this estimate, due to the spectral bandwidth of the VCSELs, and possibility of illumination on the return path
* The VCSEL array is similar to the current ams/Heptagon/Princeton Optronics VCSEL array
** Custom aspect ratio VCSEL array

FIG. 5

| L | m | n | $\delta\varphi_2, \delta\varphi_{DBR}$ | $\delta\varphi_1$ | λ |
|---|---|---|---|---|---|
| 0.28μm | 2 | 3 | 0 | 0 | 0.85μm |
| 0.28μm | 2 | 3 | 0 | π/8 | 1.05μm |
| 0.28μm | 2 | 3 | 0 | π/4 | 1.36μm |
| 0.57μm | 4 | 3 | 0 | 0 | 0.85μm |
| 0.57μm | 4 | 3 | 0 | π/8 | 0.94μm |
| 0.57μm | 4 | 3 | 0 | π/4 | 1.04μm |
| 1.7μm | 12 | 3 | 0 | 0 | 0.85μm |
| 1.7μm | 12 | 3 | 0 | π/4 | 0.91μm |
| 1.7μm | 12 | 3 | 0 | π/2 | 0.97μm |

FIG. 7

METASURFACES FOR LASER SPECKLE REDUCTION

CROSS-REFERENCE TO RELATED APPLICATIONS

This application is the national stage of PCT Application No. PCT/US2019/040302, entitled "Metasurfaces for Laser Speckle Reduction," filed Jul. 2, 2019, which application claims the benefit of U.S. Provisional Application No. 62/693,065, entitled "Metasurfaces for Laser Speckle Reduction", filed Jul. 2, 2018, the disclosures of which are incorporated herein by reference in their entireties.

FIELD OF INVENTION

The invention relates to illumination and in particular to illumination with lasers.

BACKGROUND

Many applications rely on illumination of scenes, either with structured light, flood illumination, or engineered illumination patterns. Such illumination is useful when the reflected light is to be processed in some way, for example in three-dimensional sensing, or when carrying out further processing steps on a two-dimensional image.

Correct illumination is particularly important in machine vision systems. In such systems, knowledge of the exact structure, texture, and contrast of an illuminated structure is important in subsequent processing of the article that is being inspected by the machine vision system.

Because of its low cost, narrow output beam, narrow bandwidth, and high levels of illumination, a commonly used device for such illumination a vertical-cavity surface-emitting laser, or "VCSEL."

Like most lasers, a VCSEL outputs coherent light. This poses a difficulty when illuminating rough surfaces. Such surfaces cause reflections that can interfere with the illumination beam. This leads to a random pattern with large variations in signal intensity over a small area. Such a pattern is usually referred to as "speckle."

Speckle negatively impacts the accuracy of any algorithms that processes data representative of an image.

SUMMARY

Speckle can be suppressed by promoting diversity of illumination. Examples include increasing the number of incident angles from which light illuminates the scene, increasing the number of wavelengths used to illuminate the scene, increasing the number of different polarizations used to illuminate the scene, and changing the pattern of light during the course of illumination and subsequent recording or imaging. These forms of diversity are referred to herein as angular diversity, wavelength diversity, polarization diversity, and temporal diversity.

The apparatus and methods described herein rely at least in part on a metasurface in connection with suppressing the formation of speckle using one or more of the aforementioned techniques.

In one aspect, the invention features a metasurface-enabled illuminator that replicates an illumination source across an illumination aperture via a light bar. This embodiment increases angular diversity by reducing spatial coherence.

In another aspect, the invention features a metasurface-enabled design diversifies the output wavelengths of VCSELs in a single VCSEL array individually, thereby increasing wavelength diversity.

In yet another aspect, the invention features an optical element that expands an image of a VCSEL array on another optical element to increase spatial incoherence and angular diversity.

A suitable optical element for functioning as a metasurface comprises a diffusing element that is robust to both placement and assembly error and that forms an ensemble metasurface. A typical metasurface includes nanostructures embedded in a medium with the nanostructures having an index of refraction that differs from that of the medium so as to function as diffracting centers.

In one aspect, the invention features an illumination system for illuminating an object. Such a system includes illumination source, a coupler, a light bar, and a patterned metasurface. The coupler couples light from the illumination source into the light bar. After having undergone total internal reflection within the light bar and after having interacted with the patterned metasurface, the light exits the light bar and propagates toward the object.

In some embodiments, the metasurface is patterned on a surface of the light bar. Embodiments include those in which it is patterned on a top surface and those in which it is patterned on a bottom surface. The top and bottom surface are closest and furthest respectively from an object to be illuminated.

Embodiments include those in which the patterned metasurface includes nanostructures of uniform height. These nanostructures are embedded in a medium. At the wavelength being used, the nanostructures have a higher refractive index than the medium in which they are embedded. Among these are embodiments in which the nanostructures have a refractive index greater than two at the wavelength, those in which the medium is air, and those in which the medium has an index of refraction that is less than two at the wavelength.

Further embodiments include those in which light from the illumination source is replicated at multiple diffraction locations along the patterned metasurface. Among these are embodiments in which the replicas are separated by distances greater than a coherence length of the illumination source and those in which the replicas are incoherent.

In some embodiments, light from the illumination source forms replicas that are on a top surface of the light bar, as a result of which light is diffracted upon incidence and redirected into free space. Others form replicas that are on a bottom surface of the light bar. In such cases, light incident on the bottom surface becomes diffracted as a result of interaction with the patterned metasurface, thus causing the light to no longer be totally internally reflected within the light bar and to thus be redirected into free space.

In other embodiments, the light bar's effective aperture is equal to its exposed surface.

In other embodiments, the light bar causes diversity of illumination on the object to be greater than it would have been had the object been directly illuminated without the light bar.

In other embodiments, the light bar causes speckle on the object to be less than it would have been had the object been directly illuminated without the light bar. In particular, the speckle's contrast decreases.

Embodiments further include those in which the patterned metasurface is partially reflective and partially transmissive as well as those in which the patterned metasurface has a non-zero reflection coefficient and a non-unity diffraction into a desired order.

Also among the embodiments are those in which an air gap separates the patterned metasurface from the light bar. In some embodiments, the air gap is constant. But in others, it is variable. In a particular embodiment, the air gap varies linearly.

In another aspect, the invention features an illumination system for illuminating an object. Such a system includes a VCSEL array having a design wavelength for output light. The VCSEL array comprises lasers and a patterned metasurface. The patterned metasurface causes variations in output wavelengths of the each of the lasers from the design wavelength. As a result, the lasers output light at different wavelengths.

In some embodiments, the patterned metasurface causes light output by the lasers to vary from the design wavelength by more than twenty nanometers.

Embodiments further include those in which patterned metasurface comprises first and second layers. Among these are embodiments in which the first layer is transmissive at the design wavelength and the second layer imparts different phase shifts to different lasers. Also among these embodiments are those in which the second layer is a reflective layer having a reflectivity in excess of 90% at the design wavelength, those in which the second layer is a dielectric mirror and the first layer is a metasurface that imparts a different phase shifts for different lasers, those in which the second layer is reflective over all of the different wavelengths, and those in which the first and second layers are separated by a material of uniform thickness and having a low refractive index.

In some embodiments, the patterned metasurface comprises nanostructures with uniform height and a first refractive index. The nanostructures are surrounded by a medium with a second refractive index. The first refractive index exceeds the second refractive index. Among these are embodiments in which the first refractive index is at least two and those in which the patterned metasurface has a duty cycle as a parameter. In these embodiments, the range of phase shifts introduced by changing the duty cycle generates a corresponding range of emission wavelengths.

In another aspect, the invention features an illumination system for illuminating an object. The illumination system includes a VCSEL array and a replicating layer. The array comprises a plurality of sources, each of which is a VCSEL. The sources emit light at different wavelengths. The replicating layer, which is disposed above the array, forms a plurality of synthetic sources for each source. These synthetic sources are incoherent relative to each other.

In some embodiments, the replicating layer comprises a diffraction grating.

In other embodiments, the replicating layer comprises a patterned metasurface. Among these are embodiments in which the metasurface is configured to both diffract light to form the synthetic sources and to shape beams from the synthetic sources.

In another aspect, the invention features an apparatus comprising a diffuser that has patches. Each patch comprises a metasurface. Each metasurface comprises nanostructures embedded in a medium. The nanostructures have a refractive index that is greater than that of the medium. Each metasurface carries out a different optical function.

Embodiments include those in which the patches are arranged at random and those in which they an ordered arrangement.

Embodiments further include those in which the patches carry out any two functions selected from the group consisting of beam steering, beam shaping, collimating, and functioning as a lens.

Further embodiments include those in which illuminating light is incident on a set of patches and in which the set of patches carries out a function on the illuminating light. This function is an average of functions carried out by individual patches in the set.

Further embodiments include those in which each of the patches has a rectangular boundary and those in which each of the patches has a boundary that is based on a Voronoi cell.

Still other embodiments include those in which the patches have random boundaries, those in which they have quasi-random boundaries, and those in which they define an ordered tiling.

As used herein, the terms "metasurface" and "metalayer" are used interchangeably. In either case, the term refers to a region of dielectric that includes a distribution of dielectric nanoparticles that have been strategically sized and placed so as to interact with light in particular ways. By way of analogy, prescription spectacles worn by humans interact with light in particular ways to achieve a desired distribution of light at the retina. They do so primarily as a result of their shape. A metasurface or metalayer can be thought of as a prescription spectacle that uses its distribution of nanoparticles rather than its overall shape in order to do the same thing.

These and other features of the invention will be apparent from the following detailed description and the accompanying figures, in which:

BRIEF DESCRIPTION OF THE FIGURES

FIG. 3 shows configurations of patterned metasurfaces on the illumination system of FIGS. 1 and 2;

FIG. 4 shows additional configurations of patterned metasurfaces on the illumination system of FIGS. 1 and 2;

FIG. 5 is a table showing illumination ripple as a result of different configurations of illumination sources with and without light bars of the type shown in FIGS. 1 and 2;

FIG. 7 is a table showing exemplary variations in output wavelength using the patterned metasurfaces of FIG. 6;

DETAILED DESCRIPTION

Figure 1:
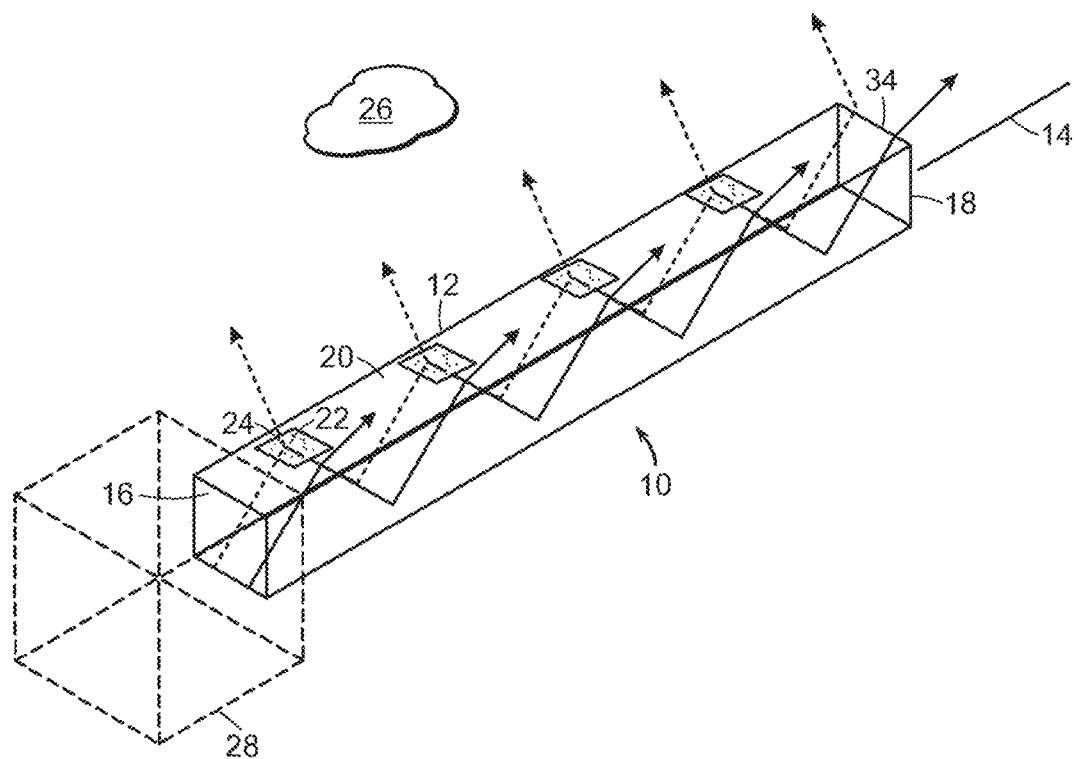
FIG. 1 shows an illumination system.

FIG. 1 shows an illumination system 10 in which a light bar 12 extends along a longitudinal axis 14 from a first end 16 to a second end 18. In the illustrated embodiment, the light bar 12 has a rectangular cross section that defines four surfaces extending along the longitudinal axis. Among these is an illuminating surface 20 having a row of patterned metasurfaces 22, each of which defines a diffraction site 24. In operation, at least some light exits the light bar 12 through each of the diffraction sites 24 and travels towards an object 26 that is to be illuminated. The illustrated embodiment shows discrete patterned metasurfaces 22. However, an alternative embodiment features a metasurface 22 that extends along the illumination surface 20 of the light bar 12 and has discrete regions for each diffraction site 24.

Figure 10:
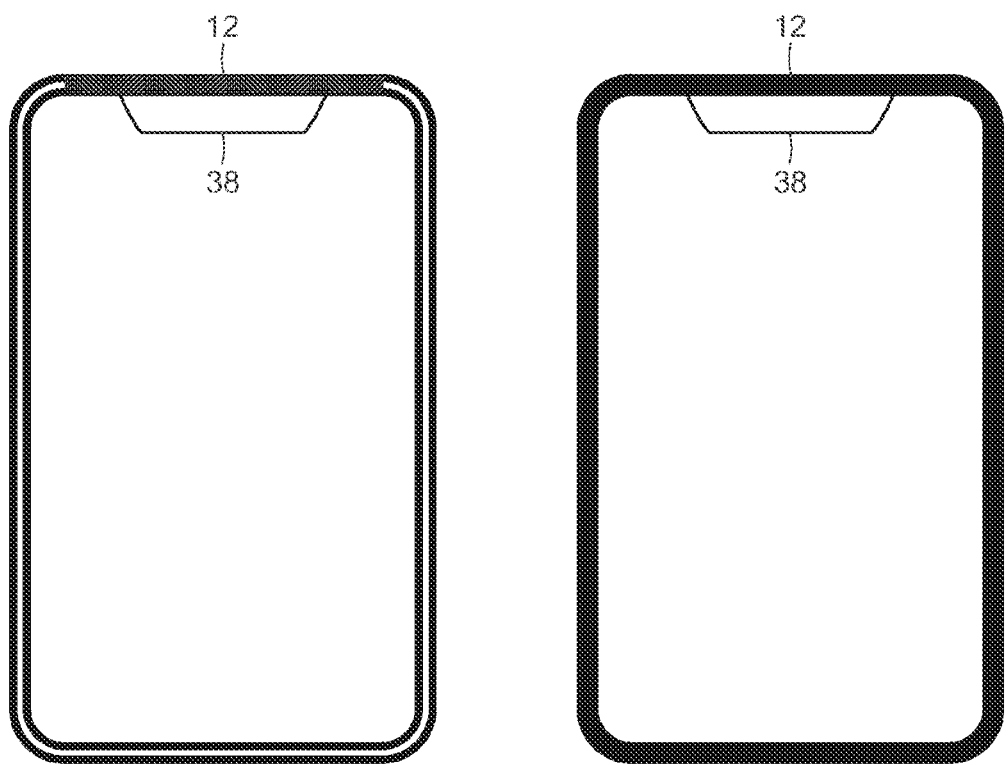
FIG. 10 shows embodiments of the light bar of FIG. 1.

The light bar 12 comprises a dielectric medium, such as glass. However, in some embodiments, as shown in FIG. 10, the light bar 12 is formed on a compliant polymer. This permits the light bar 12 to be wrapped around surfaces.

A coupler 28 at the first end 12 couples light from a VCSEL into the light bar 10 so that the light enters at an angle that causes it to undergo total internal reflection as it propagates through the light bar 12 towards the second end. A suitable coupler 28 is a prism, a mirror, or a diffracting surface. In some embodiments, the coupler 28 also collimates or otherwise initially processes the light from the VCSEL before it enters the light bar 12. In such cases, the coupler 28 carries out collimation using a metasurface, a lens sub-assembly, or a mirror facet/prism system.

Figure 2:
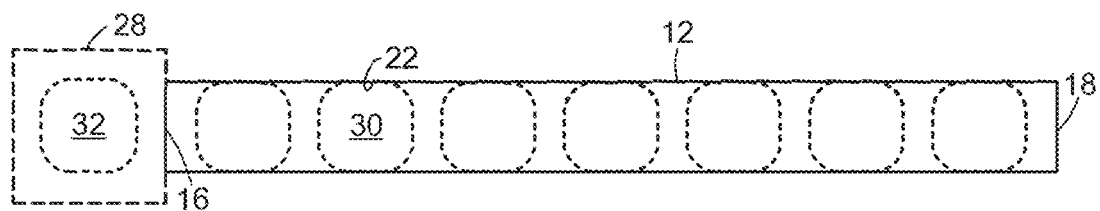
FIG. 2 shows a plan view of the illumination system of FIG. 1.

As the light from the VCSEL propagates through the light bar 12, it undergoes total internal reflection. As a result, the light falls on each of the patterned metasurfaces 22. This results in a sequence of replica images 30 of an original image 32 provided by the coupler 28, as shown in the plan view in FIG. 2. The number of such replicas 30 and the spacing between them depends on the particular wave mode.

In any case, whenever light associated with a replica 30 is incident on one of these diffraction sites 24, some of it radiates into free space and the rest of it reflects back into the light bar 12 to continue its journey along the axis 14. The light that radiates into free space at the diffraction sites 24 is the light that ultimately illuminates the object.

Each patterned metasurface 30 processes light as it exists though that diffraction site 24 in an effort to reduce speckling at the object 26. The patterned metasurface 22 at a diffraction site 24 need not the same as patterned metasurfaces 22 at other diffraction sites 24.

The patterned metasurface 22 diffracts at least some but not all of the energy carried by that mode into free space so that it is available for illuminating the object 26. Each patterned metasurface 22 thus functions as an independent light source that directs light towards the object 26 that is to be illuminated.

The presence of the patterned metasurface 22 offers certain advantages.

First, the patterned metasurface 22 is able to shape the beam so that light illuminates the object 26 according to a desired pattern. Thus, if even illumination is desired, the patterned metasurface 22 can compensate for what would otherwise by an uneven illumination pattern from a light bar 12 without a patterned metasurface 22.

Second, the distance between successive diffraction sites 24 can be selected to be longer than the coherence length of the VCSELs. This incoherent illumination reduces the likelihood of speckle.

Additionally, light enters free space via a diffraction event. This eliminates any zero-order mode while also improving eye safety.

The coherence length for light propagating in a medium with index of refraction n determined with the formula. wavelength λ, and bandwidth Δλ is given by:

$$L = \frac{2\ln(2)}{\pi n} \frac{\lambda^2}{\Delta\lambda} \quad (2)$$

In the case of a VCSEL that provides 940-nanometer light with a 1-nanometer bandwidth, with the light passing through glass having an index of 1.45, the coherence length is approximately 270 micrometers. By positioning the diffraction sites 24 along the light bar 12 at distances greater than this coherence length, it becomes possible to reduce the contrast associated with any speckle seen on the object 26. The extent to which this contrast is reduced will depend on the number of incoherent replica images 30 that exist along the light bar 12. In particular, the contrast will decrease by a factor equal to the square root of the number of such replica images 30.

Though not required, it is useful to provide a mirror 34 at the second end 18. This will permit light that did not exit the light bar 12. However, it is also possible, through suitable design of the patterned metasurfaces 22, to ensure that essentially all light will be coupled out of the light bar.

FIG. 3 illustrates examples of how to engineer the metasurface 22 at the light bar's top layer. The upper row shows transverse and longitudinal views of a phase gradient across the metasurface 22. Such a phase gradient permits light to be collimated upon exit, to create an illumination pattern, or to reproduce a pattern of dots, as is the case in structured light applications.

FIG. 4 shows implementations of partially-diffracting metasurfaces 22. The top row of FIG. 4 shows two placements of a metasurface layer 36. In the left-hand panel of the top row, the light that ultimately illuminates the object 26 does so after having been transmitted through the metasurface layer 36. In contrast, in the right-hand panel of the top row, the light that ultimately illuminates the object 26 does so after having been reflected off the metasurface layer 36.

The bottom row of FIG. 4 shows a metasurface layer 36 having reflectivity that varies as a function of position along the light bar's longitudinal axis. This permits the metasurface layer 36 to have a reflectivity that decreases monotonically towards the light bar's second end 18. A spatially-varying reflectivity of this form yields more uniform illumination along the light bar 12. In this embodiment, the variation in reflectivity comes from using frustrated total internal reflection to create a partially-reflective mirror.

In the left-hand embodiment, the reflection remains constant along the length. However, in the right-hand embodiment, the reflection coefficient changes exponentially as a result of a linearly decreasing air gap 38 between the light bar 12 and the top metasurface layer 36. Due to the phenomenon of frustrated total internal reflection, the leakage, which results in transmission into the metasurface layer 36, increases exponentially. FIGS. 3 and 4 thus illustrate how to engineer partially-reflective metasurfaces on the illuminating surface of the light bar 12 as well how to engineer the reflection to provide an exponential drop off of reflectance as the light propagates further from the source. This results in a more uniform illumination of the object 26.

FIG. 5 is a table showing the reduction in the speckle contrast associated with speckled illumination when using a light bar 12 as described herein. The speckle contrast that results from illumination by a single VCSEL with no light bar 12 is arbitrarily selected to be 100% as a baseline value. It can be seen that adding a small light bar to a single voxel reduces this contrast to 22% of what it originally was.

Figure 6:
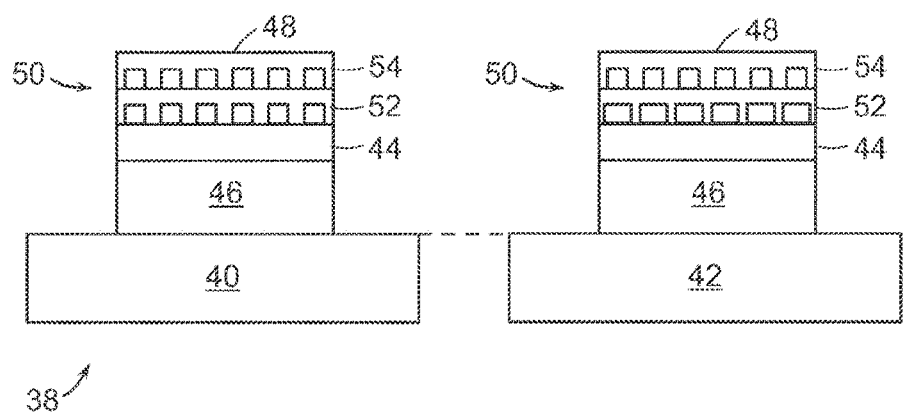
FIG. 6 shows the use of patterned metasurfaces to generate wavelength diversity in a VCSEL array.

FIG. 6 shows a configuration that achieves wavelength diversity with an array of VCSEL lasers as an illumination source.

In general, the lasers that comprise an array of VCSELs are manufactured together in the same process using the same die. As such, the wavelengths emitted by each laser will be identical. This lack of variation between lasers is often considered a desirable feature. However, it does have the disadvantage of promoting speckling on an illuminated object.

In an effort to introduce wavelength diversity, it is necessary to avoid this lack of manufacturing variability. This is achieved by using a patterned metasurface to cause different lasers in the same VCSEL array to resonate and emit at slightly different wavelengths.

FIG. 6 shows first and second lasers 40, 42 from the VCSEL array 38. Each laser 40, 42 features a quantum well 44. The quantum well 44 lies on top of a distributed Bragg reflector 46. A conventional laser would have another distributed Bragg reflector on the other side of the quantum well 44. However, in FIG. 6, this has been replaced by a patterned metasurface 50. The patterned metasurface 50 has unit cells that are smaller than a wavelength. The laser's aperture 48 is thus filled with identical unit cells. As a result, there is no phase shift across the aperture 48.

The patterned metasurface 50 or another distributed Bragg reflector reflects light back towards the quantum well 44. However, the patterned metasurface 40 also imparts a phase shift to this light. This phase shift changes the effective length of the laser's cavity, and hence its resonance. As a result, the phase shift perturbs the laser's output wavelength. By using slightly different patterned metasurfaces 50 on different lasers 40, 42, it is possible to perturb the wavelength output by each laser 40, 42. This results in wavelength diversity, which in turn reduces speckle.

The patterned metasurface 50 is typically a dielectric layer that has been etched to form sub-wavelength nanostructures. Suitable materials for use in the dielectric layer include silicon, gallium arsenide, indium gallium arsenide, or materials conventionally used in VCSEL manufacture.

In some embodiments, the patterned metasurface 50 has only a single layer. In these embodiments, both reflection and phase shifting occur within that single layer. Other embodiments, as shown in FIG. 6, includes first and second metasurface layers 52, 54, each of which is approximately a wavelength thick.

In this second embodiment, the first metasurface layer 52 is mostly transmissive. This first metasurface layer 52 imparts a phase shift onto incident light. The second metasurface layer 54 has high reflectivity and thus acts as a mirror.

Having the patterned metasurface 50 as part of the laser 40, 42 means that the laser's output wavelengths can be defined in a final lithographic step while retaining the same remaining structure of the laser across all lasers in the array.

The phase shift perturbs the laser's output wavelength by changing its effective cavity length. This effective cavity length is given by the sum of the cavity's nominal length L and an additional length that results from summing the various phase shifts that occur:

$$L_{eff} = L + \frac{\lambda}{2\pi}(\delta\varphi_1 + \delta\varphi_2/2 + \delta\varphi_{DBR}/2)$$

where:
$L_{eff}$ is the effective cavity length,
L is the nominal length of the cavity,
$\lambda$ is the design wavelength,
$\delta\varphi_1$ is the phase shift imparted by the first metasurface layer 52,
$\delta\varphi_2$ is the phase shift imparted by the second metasurface layer 54 during reflection, and
$\delta\varphi_{DBR}$ is the phase shift imparted by the distributed Bragg reflector 46 during reflection.

The output wavelength of the laser 40, 42 is then given by the cavity resonance condition:

$$m\lambda = 2nL_{eff}(\lambda), m \in \mathbb{Z}$$

where n is the group index of the VCSEL structure averaged over the cavity and m is an integer representing the number of integral wavelengths that fit in the cavity. As a result, the output wavelength of the laser 40, 42 can be arbitrarily chosen so long as it remains reflected by the mirror metasurface. This output wavelength is given by:

$$\lambda = \frac{2nL}{m - n(\delta\varphi_1 + \delta\varphi_2/2 + \delta\varphi_{DBR}/2)/\pi}, m \in \mathbb{Z}$$

VCSELs are short-cavity lasers. This means that m is small. Therefore, a large range of wavelengths can be covered by suitably engineering the patterned metasurface.

As shown in the exemplary calculations in FIG. 7, it is possible to use this phase shift to vary the output wavelength of even modestly-sized cavities by a significant amount. As an additional benefit, it is also possible to suppress undesired lasing modes. This can be done by overlapping the designed emission wavelength with an appropriate reflecting metasurface designed for that wavelength.

A useful definition of speckle contrast is the ratio of the standard deviation of the intensity of a speckled field with its mean intensity, $C = \sigma_X/\overline{X}$. Using the foregoing definition, the reduction of speckle contrast gained by this type of construction can be quantified by the following equation:

$$C = [1 + 2\pi^2(\delta v/\overline{v})^2(\sigma_h/\overline{\lambda})^2(\cos\theta_o + \cos\theta_i)^2]^{-1/4}$$

Where:
C is the speckle contrast,
$\overline{v}, \overline{\lambda}$ are the illumination center frequency and wavelength, respectively,
$\delta v$ is the illumination bandwidth (assuming a gaussian intensity distribution),
$\sigma_h$ is the illuminated surface root mean square roughness, and
$\theta_o, \theta_i$ are the output ray angle and input ray angle, respectively, with respect to the surface.

It is apparent from inspection that contrast C goes as $C \sim \delta v^{-1/2}$. Therefore, increasing the illumination bandwidth by a factor of nine, which would be the roughly equivalent of using an LED instead of a VCSEL, would decrease the contrast by a factor of three. Gains may be larger than the above theoretical prediction in an actual system.

In certain applications, it may be beneficial to impart an additional phase gradient to the metasurface to spread out, diffract, or steer light exiting the VCSEL.

Figure 8:
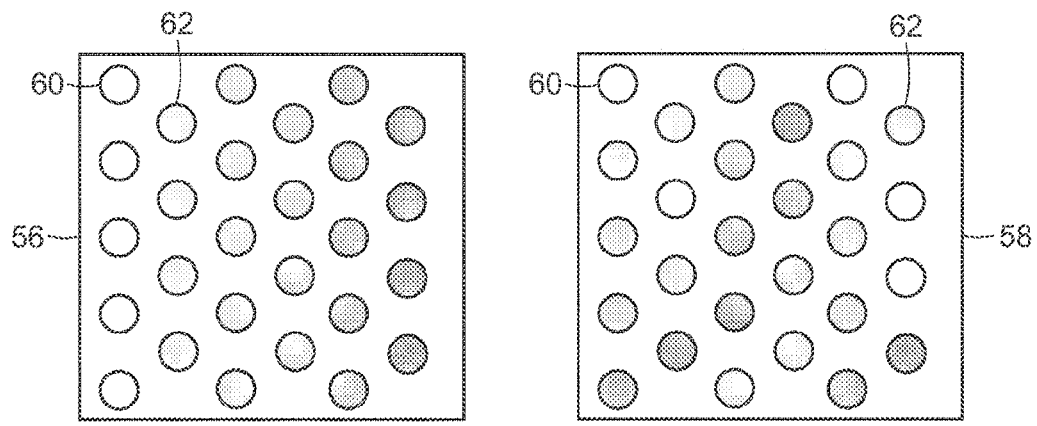
FIG. 8 shows exemplary wavelength distributions across VCSEL arrays implemented by the patterned metasurfaces of FIG. 6.

FIG. 8 shows a first VCSEL array 56 and a second VCSEL array 58. Each array has first and second lasers 60, 62 that output light at corresponding first and second wavelengths. The difference between the first and second wavelength is smaller than the difference between the first wavelength and any other wavelength that comes from the array 56, 58.

In the first array 56, the lasers are grouped by wavelength so that the first and second lasers 60, 62 are neighbors. This results in a wavelength gradient across the first array 56. In the second array 58, the first and second lasers 60, 62 are no longer neighbors.

It is apparent from FIG. 8 that by appropriately manufacturing the metalayer, it is possible to create arbitrary distributions of wavelength sources across the array 56, 58.

The creation of wavelength diversity described in connection with FIG. 6 comes at the cost of angular diversity. For a given wavelength, the object 26 will be illuminated by fewer lasers.

Figure 9:
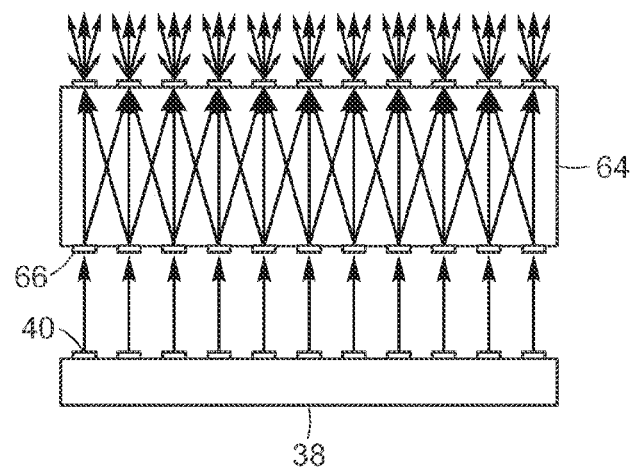
FIG. 9 shows a replicating layer for replicating sources to create spatially incoherent synthetic sources.

FIG. 9 alleviates this difficulty by passing the beams of the lasers 40 through a replicating layer 64. The replicating layer 64 effectively replicates each beam. The replicated beams will then act as different sources that illuminate the object 26 with light that is incident from different angles. This promotes angular diversity.

In some embodiments, the replicating layer 64 includes a diffraction grating that replicates each beam into multiple diffraction orders or angles. In other embodiments, the replicating layer 64 comprises another patterned metasurface. In the latter case, the patterned metasurface can be configured to both diffract and collimate. Additionally, the patterned metasurface can have different patterns at different locations 66 so as to optimize for the particular laser 40 that is being used to illuminate that location.

The height of the replicating layer 64 exceeds a minimum height so as to ensure destruction of coherence between the spatially separate replicated beams. In other words, by using the low temporal coherence of the individual VCSELs, it is possible to destroy spatial coherence for the spatially separated beams that emerge from the replication layer 64. This follows from the equation:

$$L = \frac{2\ln(2)}{\pi n} \frac{\lambda^2}{\Delta\lambda} \qquad (2)$$

where:
  L is the coherence length,
  n is the refractive index of the medium through which the light propagates,
  $\lambda$ is the illumination wavelength, and
  $\Delta\lambda$ is the bandwidth of the illumination.

So long as the path length difference between two beams that diffract from the same point and that fall on the object 26 is longer than L, which is a function of the thickness of the replicating layer 64 as well as the angle of diffraction, the replicated beams will be mutually incoherent.

By repeating this process across the array 38, the lasers 40 can in effect be replicated into synthetic sources. The light from these replications fills a large spatial extent at the object 26. This reduces speckle by increasing the angular diversity of the illuminated scene.

The replicating layer 64, whether it takes the form of a diffraction grating or another patterned metasurface, can be tailored to function for each laser 40 or set of lasers 40 independently by changing the nanostructure of that metasurface or grating, and tuning it to exhibit maximum design efficiency for the wavelength of the particular laser that is illuminating it that portion of thee replicating layer 64. A metasurface design can also include beam shaping capability integrated with the diffraction grating.

An optional diffuser provides more even illumination. In some cases, a diffuser is a refractive diffuser in which small lenses have been distributed, either statistically or according to some design, so as to focus or collimate light in different patterns. In such diffusers, it is possible to control the distribution of sizes and radii of curvature for the lenses so as to achieve some desired intensity distribution of illumination.

However, such diffusers are limited by the forms that these lenses can take. As a practical matter, these lenses are simple spherical lenses. Hence, the number of degrees of freedom is limited to radius of curvature and size. Only when the ensemble of the far field distribution of the micro-lens elements comes together in the far field will a custom intensity distribution be formed.

An alternative approach is to form the diffuser from an ensemble of metasurfaces. In such cases, the design is not constrained by the need to rely on spherical lenses. As such, these metasurfaces can be configured to carry out different functions.

Figure 11:
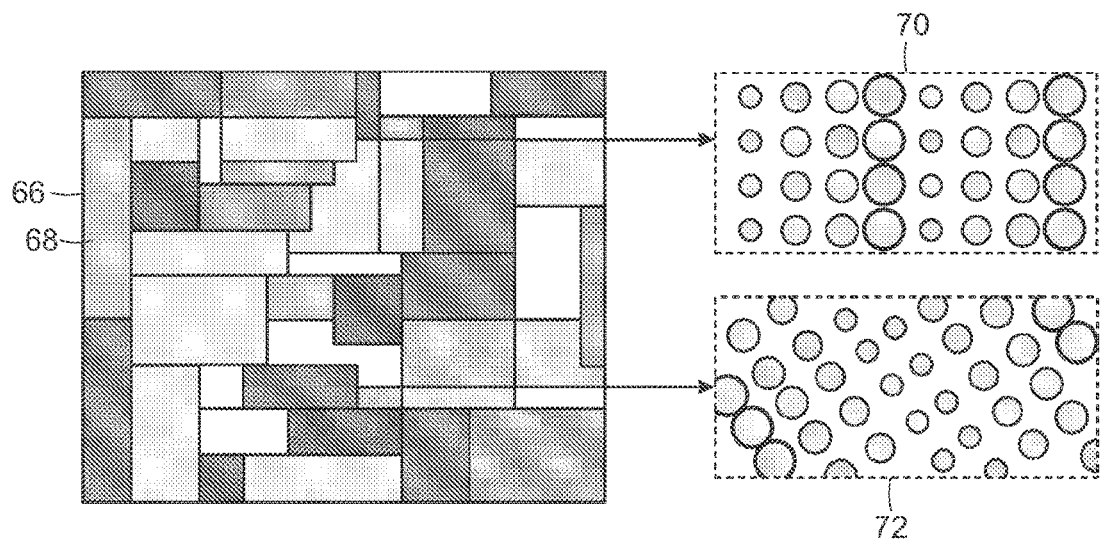
FIG. 11 shows a patchwork diffuser in which each patch is a metasurface.

FIG. 11 shows a plan view of a diffuser 66 made by patches 68, each of which is a different metasurface having a different arrangement of scattering elements. Although the patches 68 shown are rectangular, this is only by way of illustration. Each patch 68 is typically multiple wavelengths in size.

In some embodiments, some patches 68 carry out beam steering functions. In such embodiments, each patch 68 steers the beam into a certain angle. A far-field intensity profile can then be reproduced by specifying the appropriate distribution of phase profiles for each subcomponent.

A particular source 40, after having been replicated by the replication layer 64, may illuminate several patches 68. As shown in the expanded view, first and second patches 70, 72 may have substantially different designs. In the example shown, the first patch 70 shows a design for a blazed-grating and the second patch 72 shows a design for a diverging lens.

The metasurfaces 74 shown in the first and second patches 70, 72 are circular in form. However, other embodiments feature metasurfaces that are elliptical, rectangular, triangular, polygonal, described by a parametric curve, or described by a Bezier curve.

Figure 12:
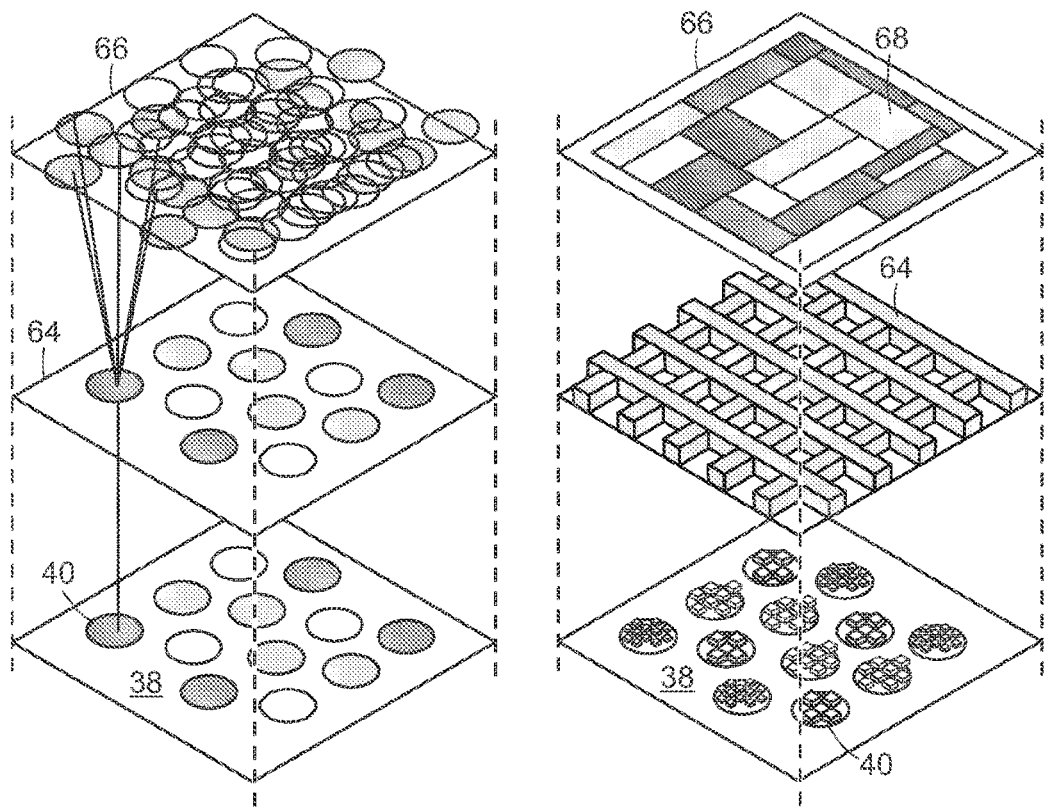
FIG. 12 shows an illumination system that incorporates multiple ones of the foregoing features.

FIG. 12 shows an illumination system that combines some of the foregoing features to reduce speckle in illumination.

The left side of FIG. 12 shows a ray path for a ray that begins at a laser 40 on a VCSEL array 38. The ray passes through a replicating layer 64 disposed above the VCSEL array 38. Shading shows targets upon which the same wavelength is incident. The replicating layer 64 replicates the rays, each of which is incident on a different metasurface patch 68 on the diffuser 66.

The right side of FIG. 12 shows the same structure as that on the left but with schematic representations of the different metsurfaces shown. The metasurface patches and the crossed grating in the illustrated replicating layer 64 are more clearly seen in the right-hand illustration. The differing nanostructures, that overlie each laser 40 and that perturb the lasers' output frequencies can also be clearly seen in the right-hand illustration in FIG. 12.

Having described the invention and a preferred embodiment thereof, what is claimed as new and secured by Letters Patent is:

1. An apparatus comprising an illumination system for illuminating an object, said illumination system comprising a VCSEL array having a design wavelength for output light and a patterned metasurface comprising a first metasurface layer and a second metasurface layer, wherein the first metasurface layer is in a different plane from the second metasurface layer, wherein said VCSEL array comprises lasers each including a quantum well, wherein, for each laser, said patterned metasurface causes variations in output wavelengths from the quantum well such that each of said lasers output light at different wavelengths, and wherein the light from each laser passes through the first metasurface layer and then the second metasurface layer, and wherein the first metasurface layer is transmissive at the design wavelength and imparts a phase shift, and wherein the phase shift from the first metasurface layer differs for each laser.

2. The apparatus of claim 1, wherein said patterned metasurface causes light that is output by said lasers to be varied from said design wavelength by more than twenty nanometers.

3. The apparatus of claim 1, wherein the patterned metasurface comprises nanostructures with uniform height and a first refractive index, wherein said nanostructures are surrounded by a medium with a second refractive index, wherein said first refractive index exceeds said second refractive index.

4. The apparatus of claim 3, wherein said first refractive index is at least two.

5. The apparatus of claim 3, wherein the patterned metasurface has a duty cycle as a parameter, wherein a range of phase shifts introduced by changing said duty cycle generates a corresponding range of emission wavelengths.

6. The apparatus of claim 1, wherein said second metasurface layer has a reflectivity in excess of 90% at said design wavelength.

7. The apparatus of claim 1, wherein said second metasurface layer is a dielectric mirror.

8. The apparatus of claim 1, wherein said second metasurface layer is reflective over all of said different wavelengths.

9. The apparatus of claim 1, wherein said first metasurface layer and said second metasurface layer are separated by a material, wherein said material is of uniform thickness, wherein said material has a lower refractive index than the first metasurface layer.

\* \* \* \* \*